(12) United States Patent
Inoue

(10) Patent No.: US 9,118,303 B2
(45) Date of Patent: Aug. 25, 2015

(54) FILTER, DUPLEXER, AND COMMUNICATION MODULE

(71) Applicant: TAIYO YUDEN CO., LTD., Tokyo (JP)

(72) Inventor: Shogo Inoue, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 173 days.

(21) Appl. No.: 13/872,360

(22) Filed: Apr. 29, 2013

(65) Prior Publication Data

US 2013/0314173 A1 Nov. 28, 2013

(30) Foreign Application Priority Data

May 24, 2012 (JP) .................................. 2012-118881

(51) Int. Cl.
| | |
|---|---|
| *H01L 41/00* | (2013.01) |
| *H03H 9/00* | (2006.01) |
| *H03H 9/70* | (2006.01) |
| *H03H 9/54* | (2006.01) |
| *H03H 9/05* | (2006.01) |
| *H03H 9/64* | (2006.01) |

(52) U.S. Cl.
CPC .............. *H03H 9/70* (2013.01); *H03H 9/0576* (2013.01); *H03H 9/54* (2013.01); *H03H 9/6483* (2013.01); *H03H 9/6479* (2013.01)

(58) Field of Classification Search
CPC ........ H03H 9/725; H03H 9/0576; H03H 9/72; H03H 9/706; H03H 9/6483
USPC ...................... 333/126–129, 132–135, 25, 26, 333/189–193, 195
See application file for complete search history.

(56) References Cited

U.S. PATENT DOCUMENTS

| | | | |
|---|---|---|---|
| 2002/0153969 A1 | 10/2002 | Inoue et al. | |
| 2010/0026419 A1* | 2/2010 | Hara et al. | ..................... 333/175 |
| 2011/0193650 A1* | 8/2011 | Takenoshita et al. | .............. 333/4 |

FOREIGN PATENT DOCUMENTS

JP 2002-319842 A 10/2002

* cited by examiner

*Primary Examiner* — Lincoln Donovan
*Assistant Examiner* — Diana J Cheng
(74) *Attorney, Agent, or Firm* — Chen Yoshimura LLP

(57) ABSTRACT

A filter includes: acoustic wave resonators connected between an input terminal and an output terminal; and a cancel circuit including an input connection portion and an output connection portion connected so that the cancel circuit is connected in parallel to at least a part of the acoustic wave resonators, wherein the cancel circuit includes a first acoustic wave resonator connected between a node between the input connection portion and the output connection portion and a ground.

19 Claims, 29 Drawing Sheets

— FIRST VARIATION OF FIRST EMBODIMENT
— FIRST EMBODIMENT
— — FIRST COMPARATIVE EXAMPLE

FILTER, DUPLEXER, AND COMMUNICATION MODULE

CROSS-REFERENCE TO RELATED APPLICATION

This application is based upon and claims the benefit of priority of the prior Japanese Patent Application No. 2012-118881, filed on May 24, 2012, the entire contents of which are incorporated herein by reference.

FIELD

A certain aspect of the present invention relates to a filter, a duplexer, and a communication module.

BACKGROUND

Frequency bands for wireless communications have rapidly increased with diffusion of mobile phones in recent years. To use limited frequency resources effectively, a frequency interval (guard band) between a transmission band and a reception band assigned to a communication system becomes smaller. Moreover, a frequency interval between different communication systems also becomes smaller.

Such a circumstance requires a filter and a duplexer used in a wireless communication device such as a mobile phone terminal to reduce frequencies for switching from a pass band to a blocking band. That is to say, a filter and a duplexer are desired to have a steep cutoff characteristic. When an acoustic wave resonator is used for a filter or duplexer, a cutoff characteristic can be made steep by making an electromechanical coupling coefficient small as disclosed in Japanese Patent Application Publication No. 2002-319842. Moreover, a degree of suppression in a blocking band of the filter or duplexer is required to be high to prevent interference between a transmission signal and a reception signal, or interference between different communication systems.

When an acoustic wave resonator is used for a filter or duplexer, a cutoff characteristic can be made steep by making an electromechanical coupling coefficient small. However, there is a tradeoff relationship that a passband width becomes narrow as a cutoff characteristic becomes steep, and a cutoff characteristic is difficult to be made steep with maintaining the passband width. In addition, a degree of suppression in a blocking band is in a tradeoff relationship with a loss in a passband, and it is difficult to improve the degree of suppression in the blocking band with suppressing an increase in loss in the passband.

SUMMARY OF THE INVENTION

According to an aspect of the present invention, there is provided a filter including: acoustic wave resonators connected between an input terminal and an output terminal; and a cancel circuit including an input connection portion and an output connection portion connected so that the cancel circuit is connected in parallel to at least a part of the acoustic wave resonators, wherein the cancel circuit includes a first acoustic wave resonator connected between a node between the input connection portion and the output connection portion and a ground.

According to another aspect of the present invention, there is provided a duplexer including: a first filter that is connected between an antenna terminal and a first terminal and includes acoustic wave resonators; a second filter that is connected between the antenna terminal and a second terminal, includes acoustic wave resonators, and has a passband higher than a passband of the first filter; and a cancel circuit that includes an input connection portion and an output connection portion connected so that the cancel circuit is connected in parallel to at least a part of the acoustic wave resonators included in the first filter or to at least a part of the acoustic wave resonators included in the second filter, wherein the cancel circuit includes a first acoustic wave resonator connected between a node between the input connection portion and the output connection portion and a ground.

According to another aspect of the present invention, there is provided a communication module including the above described filter or the above described duplexer.

DETAILED DESCRIPTION

Figure 1:
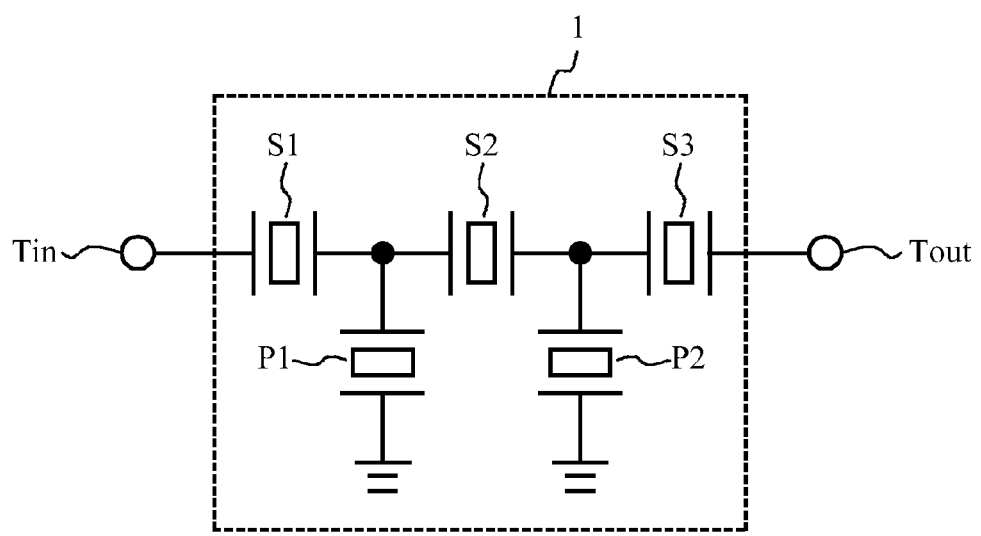
FIG. 1 is a circuit diagram illustrating a ladder-type filter.

A description will be given of a filter using an acoustic wave resonator, the filter being used for a filter or duplexer used in a wireless communication device such as a mobile phone terminal. FIG. 1 is a circuit diagram illustrating a ladder-type filter. As illustrated in FIG. 1, a ladder-type filter 1 includes acoustic wave resonators S1 through S3 connected in series and acoustic wave resonators P1 and P2 connected in parallel between an input terminal Tin and an output terminal Tout.

Figure 2:
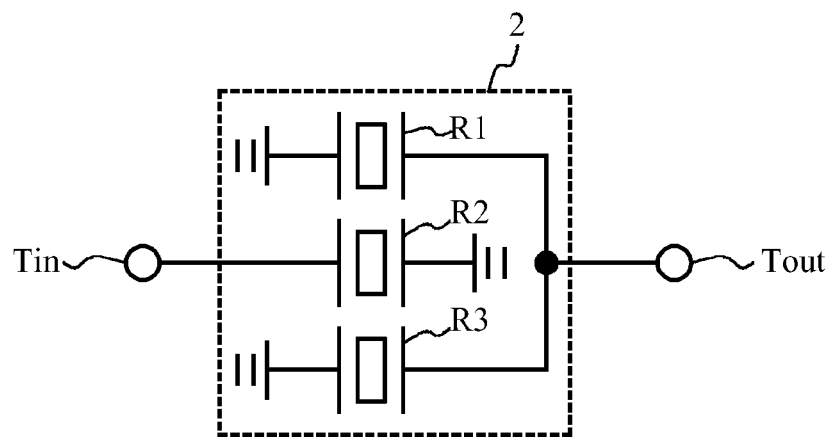
FIG. 2 is a circuit diagram illustrating a multimode type filter.

FIG. 2 is a circuit diagram illustrating a multimode type filter. As illustrated in FIG. 2, a multimode type filter 2 includes acoustic wave resonators R1 through R3. The acoustic wave resonators R1 through R3 are arranged in a propagation direction of an acoustic wave. A first end of the acoustic wave resonator R2 is coupled to the input terminal Tin, and a second end is coupled to a ground. First ends of the acoustic wave resonators R1 and R3 are coupled to the output terminal Tout, and second ends are connected to a ground.

Figure 3:
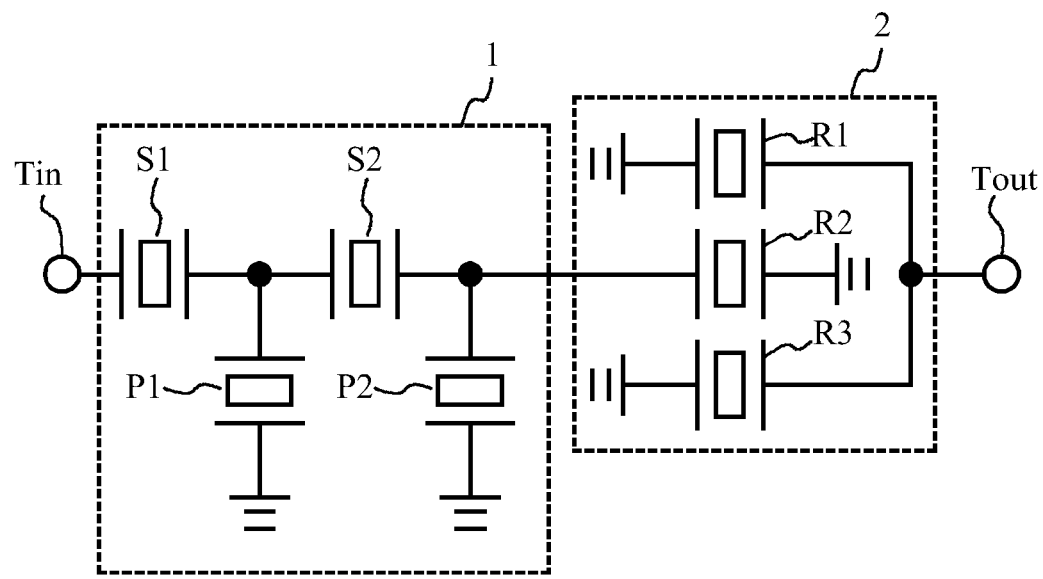
FIG. 3 is a circuit diagram illustrating a filter formed by combining a ladder-type filter and a multimode type filter.

FIG. 3 is a circuit diagram illustrating a filter formed by combining a ladder-type filter and a multimode type filter. As illustrated in FIG. 3, the ladder-type filter 1 and the multimode type filter 2 are connected in series between the input terminal Tin and the output terminal Tout.

Figure 4:
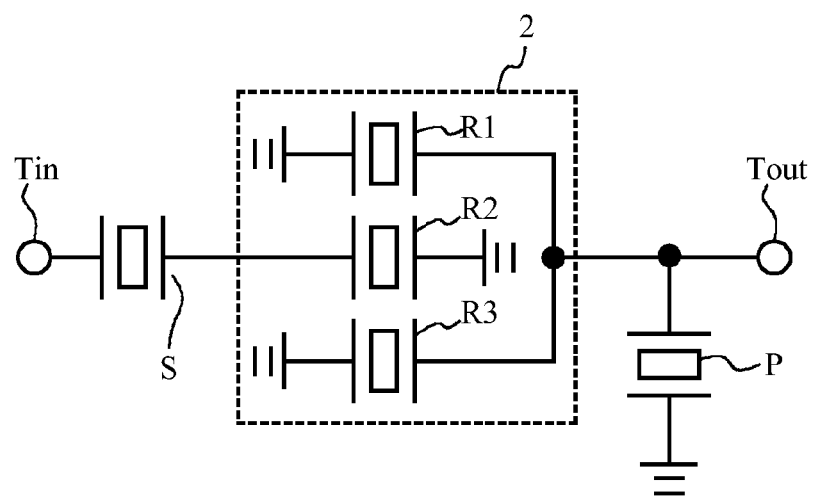
FIG. 4 is a circuit diagram illustrating a filter formed by combining a multimode type filter and acoustic wave resonators.

FIG. 4 is a circuit diagram illustrating a filter formed by combining a multimode type filter and acoustic wave resonators. As illustrated in FIG. 4, a resonator S and the multimode type filter 2 are connected in series and a resonator P is connected in parallel between the input terminal Tin and the output terminal Tout.

Any one of the filters described in FIG. 1 through FIG. 4 can be used as a filter used in a wireless communication device such as a mobile phone terminal, or a transmission filter and a reception filter in a duplexer used in a wireless communication device such as a mobile phone terminal.

Figure 5A:
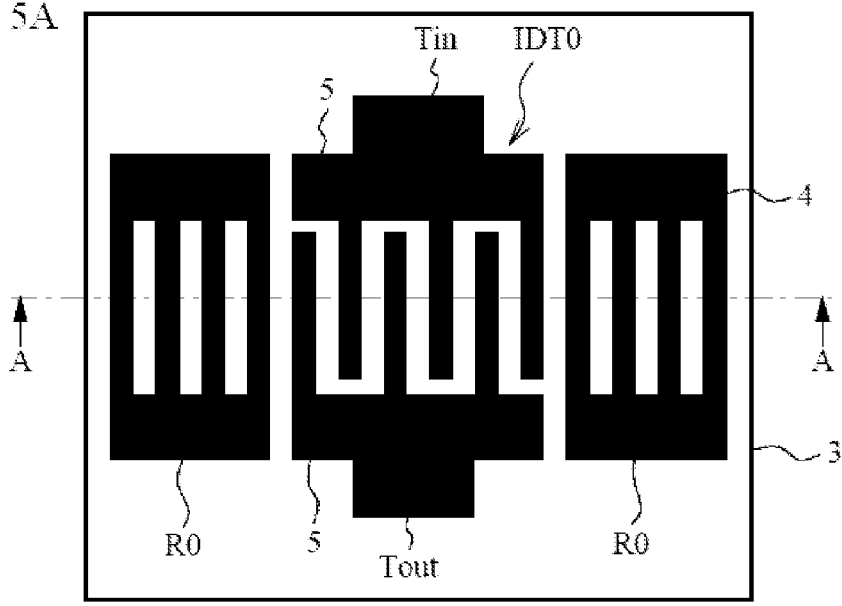
FIG. 5A is a plan view illustrating a surface acoustic wave resonator.
Figure 5B:
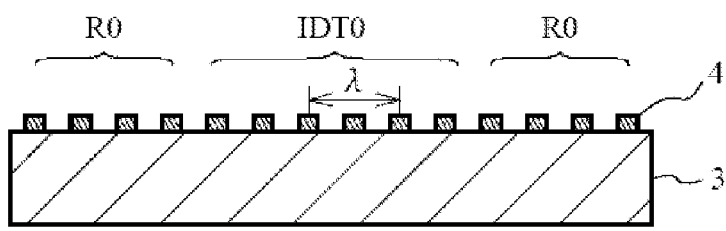
FIG. 5B is a cross-sectional view taken along line A-A in FIG. 5A.
Figure 5C:
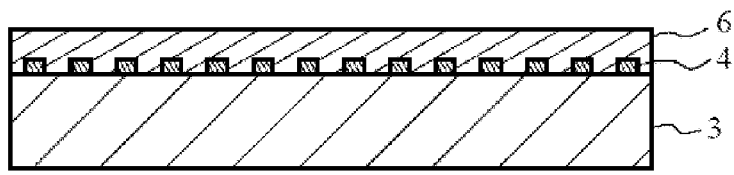
FIG. 5C is a cross-sectional view of a Love wave resonator.
Figure 5D:
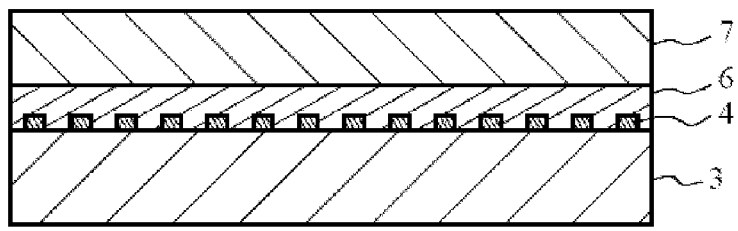
FIG. 5D is a cross-sectional view of a boundary acoustic wave resonator.

A description will now be given of an acoustic wave resonator used in a filter. FIG. 5A is a plan view illustrating a surface acoustic wave resonator, and FIG. 5B is a cross-sectional view taken along line A-A in FIG. 5A. FIG. 5C is a cross-sectional view of a Love wave resonator, and FIG. 5D is a cross-sectional view of a boundary acoustic wave resonator. As illustrated in FIG. 5A and FIG. 5B, a metal film 4 such as aluminum or copper is formed on a piezoelectric substrate 3 such as lithium tantalate or lithium niobate. The metal film 4 forms reflectors R0, an IDT (Interdigital Transducer) IDT0, the input terminal Tin, and the output terminal Tout. The IDT0 includes two comb-shaped electrodes 5. The input terminal Tin is coupled to one of the comb-shaped electrodes 5, and the output terminal Tout is coupled to the other one. The input terminal Tin and the output terminal Tout are pads for example. The reflectors R0 are located at both sides of the IDT0 in the propagation direction of the acoustic wave. The comb-shaped electrodes 5 and the reflectors R0 include electrode fingers arranged at an interval corresponding to the wavelength λ of the acoustic wave. The reflectors R0 reflect the acoustic wave excited by the IDT0. This allows the surface acoustic wave resonator to resonate at a frequency corresponding to the wavelength λ of the acoustic wave.

The plan views of the Love wave resonator and the boundary acoustic wave resonator are the same as FIG. 5A, and thus a description thereof is omitted. As illustrated in FIG. 5C, the Love wave resonator includes a dielectric film 6 formed so as to cover the metal film 4. The dielectric film 6 may be a silicon oxide film for example. As illustrated in FIG. 5D, the boundary acoustic wave resonator further includes a dielectric film 7 formed on the dielectric film 6. The dielectric film 7 may be an aluminum oxide film for example. To confine the acoustic wave in the dielectric film 6, an acoustic velocity in the dielectric film 7 is preferably faster than that in the dielectric film 6.

Figure 6A:
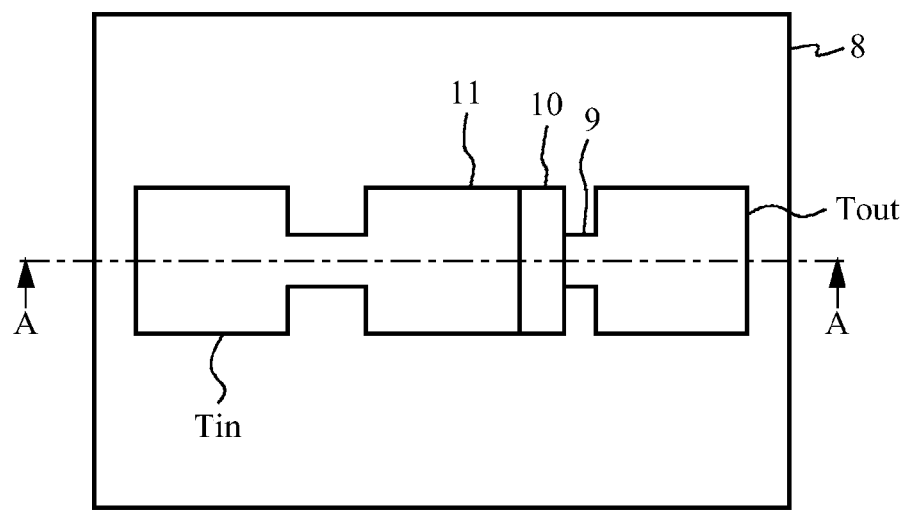
FIG. 6A is a plan view illustrating a piezoelectric thin film resonator.
Figure 6B:
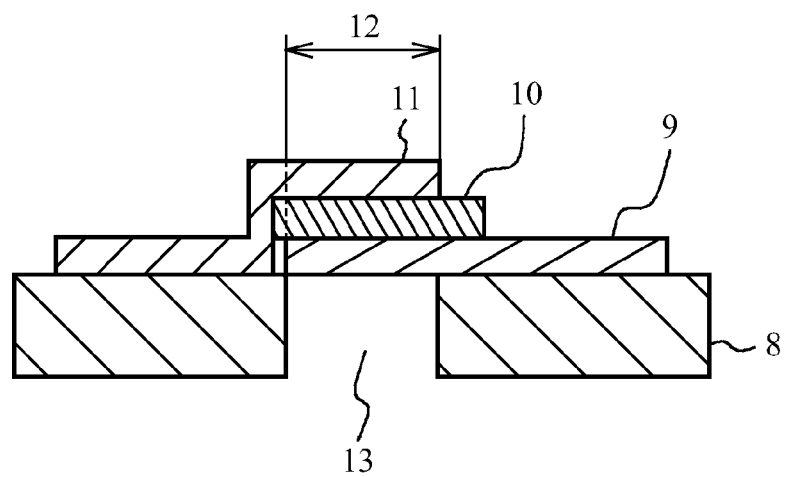
FIG. 6B is a cross-sectional view taken along line A-A in FIG. 6A.

FIG. 6A is a plan view illustrating a piezoelectric thin film resonator, and FIG. 6B is a cross-sectional view taken along line A-A in FIG. 6A. As illustrated in FIG. 6A and FIG. 6B, a lower electrode 9, a piezoelectric film 10 such as aluminum nitride, and an upper electrode 11 are stacked on a substrate 8 such as silicon in this order from the substrate 8 side. A resonance region 12 is a region in which the lower electrode 9 and the upper electrode 11 overlap each other across the piezoelectric film 10. The resonance region 12 resonates the acoustic wave that is excited in the piezoelectric film 10 and propagates in a vertical direction (bulk wave in thickness longitudinal vibration). A penetration hole 13 piercing through the substrate 8 is formed in the substrate 8 below the resonance region 12. Instead of the penetration hole 13, an open space may be formed by removing a part of the substrate 8, a dome-shaped space may be formed between the substrate 8 and the lower electrode 9, or an acoustic multilayered film that reflects the acoustic wave may be formed.

At least one of the surface acoustic wave resonator, the Love wave resonator, the boundary acoustic wave resonator, and the piezoelectric thin film resonator described in FIG. 5A through FIG. 6B can be used for an acoustic wave resonator in the filters described in FIG. 1 through FIG. 4.

Figure 7A:
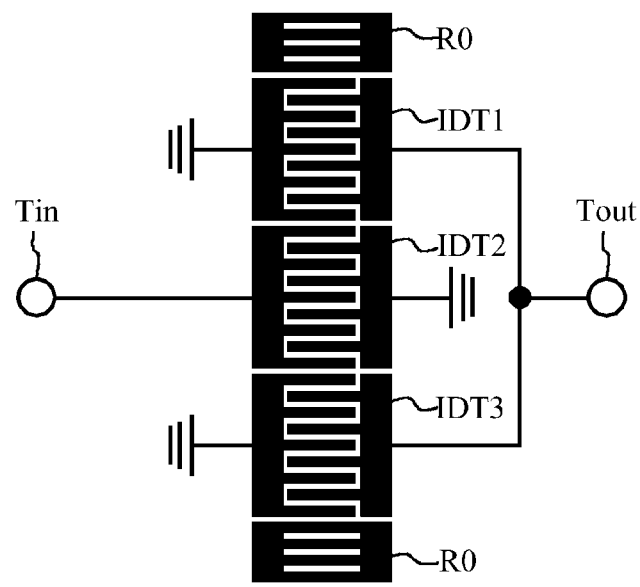
FIG. 7A is a plan view of a multimode type filter using a surface acoustic wave resonator, a Love wave resonator, or a boundary acoustic wave resonator.
Figure 7B:
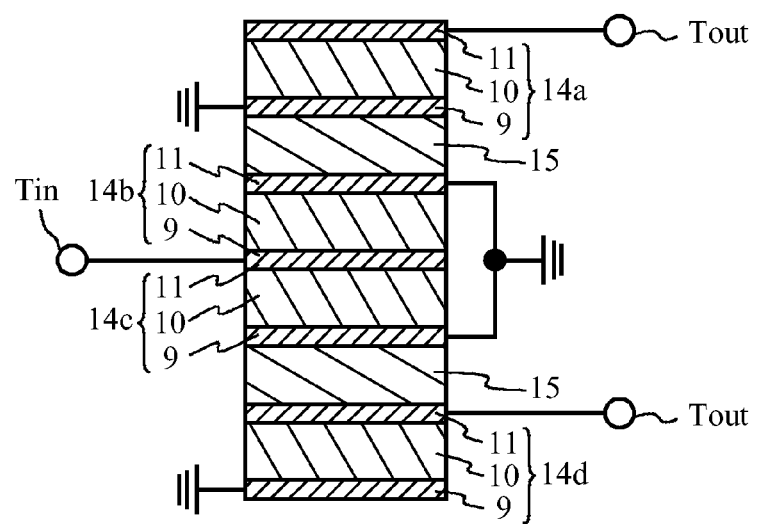
FIG. 7B is a cross-sectional view of a multimode type filter using a piezoelectric thin film resonator.

A detail description will now be given of a multimode type filter. FIG. 7A is a plan view of a multimode type filter using a surface acoustic wave resonator, a Love wave resonator, or a boundary acoustic wave resonator, and FIG. 7B is a cross-sectional view of a multimode type filter using a piezoelectric thin film resonator. As illustrated in FIG. 7A, an IDT1 through an IDT3 are arranged in the propagation direction of the acoustic wave between the reflectors R0. A first comb-shaped electrode of the IDT2 is coupled to the input terminal Tin. First comb-shaped electrodes of the IDT1 and IDT3 are coupled to the common output terminal Tout. This configuration allows an unbalanced signal input to the input terminal Tin to be output from the output terminal Tout as an unbalanced signal.

As illustrated in FIG. 7B, piezoelectric thin film resonators 14a through 14d are stacked. Each of them includes the piezoelectric film 10, and the lower electrode 9 and the upper electrode 11 sandwiching the piezoelectric film 10. Dielectric films 15 are located between the piezoelectric thin film resonators 14a and 14b, and between the piezoelectric thin film resonators 14c and 14d. The upper electrode 11 of the piezoelectric thin film resonator 14a is connected to a first output terminal Tout, and the upper electrode 11 of the piezoelectric thin film resonator 14d is connected to a second output terminal Tout. The lower electrode 9 of the piezoelectric thin film resonator 14b and the upper electrode 11 of the piezoelectric thin film resonator 14c are a shared electrode, and connected to the input terminal Tin. The above configuration allows an unbalanced signal input to the input terminal Tin to be output from the output terminal Tout as a balanced signal.

A multimode type filter using a surface acoustic wave resonator, a Love wave resonator, or a boundary acoustic wave resonator can also have an unbalanced input-balanced output, and a multimode type filter using a piezoelectric thin film resonator can have an unbalanced input-unbalanced output. As described above, the multimode type filters can have either of an unbalanced output and a balanced output.

Hereinafter, first through fifth embodiments describe exemplary duplexers using the ladder-type filter described in FIG. 1.

First Embodiment

Figure 8A:
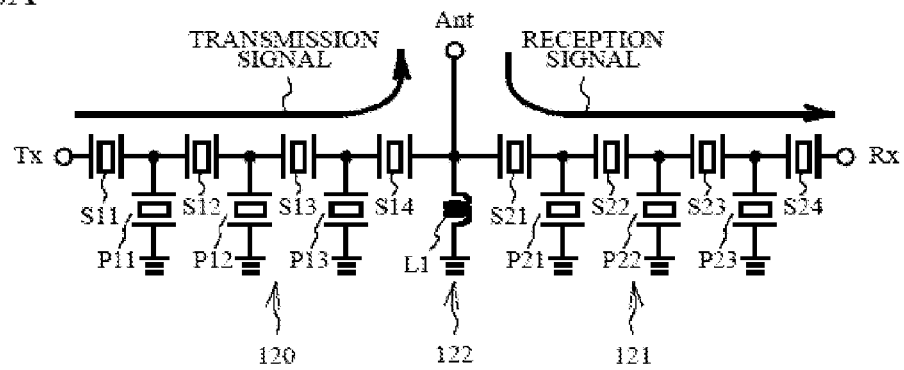
FIG. 8A is a circuit diagram of a duplexer in accordance with a first comparative example.
Figure 8B:
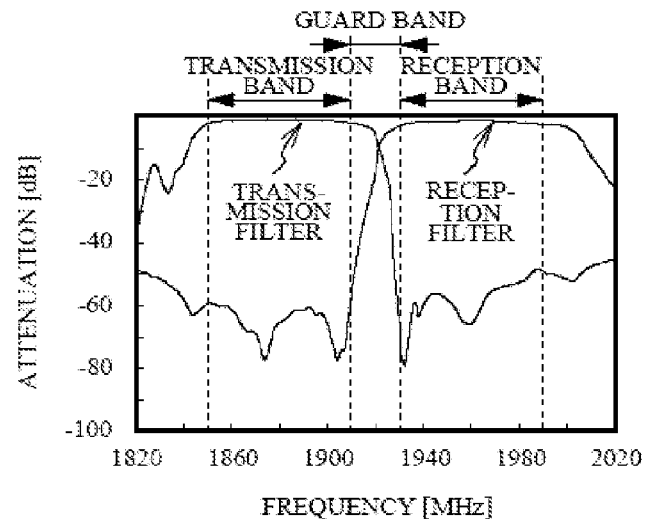
FIG. 8B illustrates simulation results of pass amplitude characteristics of a transmission filter and a reception filter.
Figure 8C:
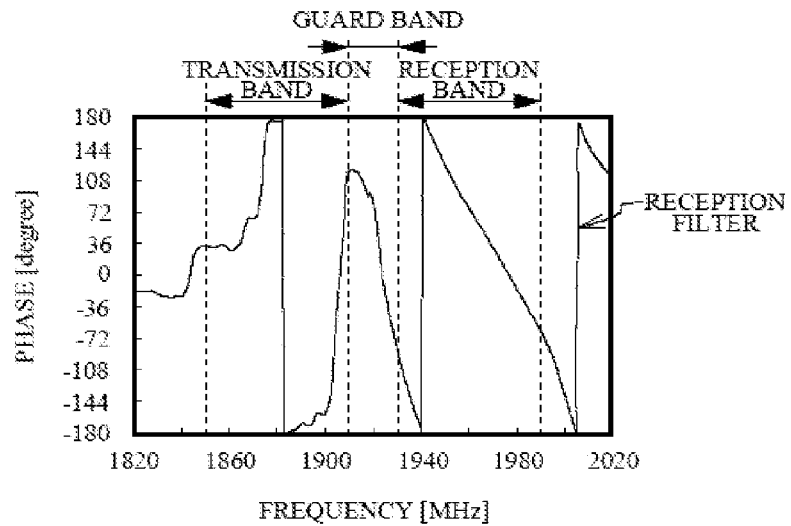
FIG. 8C illustrates simulation results of a pass phase characteristic of the reception filter.

A description will be given of a duplexer in accordance with a first comparative example before a description of a duplexer in accordance with the first embodiment is given. Duplexers described in the embodiments and comparative examples hereinafter are duplexers for North American PCS (Personal Communication Service), of which the transmission band is 1850 to 1910 MHz, and the reception band is 1930 to 1990 MHz. FIG. 8A is a circuit diagram of the duplexer in accordance with the first comparative example, FIG. 8B illustrates simulation results of pass amplitude characteristics of a transmission filter and a reception filter, and FIG. 8C illustrates simulation results of a pass phase characteristic of the reception filter. As illustrated in FIG. 8A, the duplexer of the first comparative example includes a transmission filter 120 connected between an antenna terminal Ant and a transmission terminal Tx, a reception filter 121 connected between the antenna terminal Ant and a reception terminal Rx, and a matching circuit 122. The transmission filter 120 and the reception filter 121 are ladder-type filters. The transmission filter 120 includes series resonators S11 through S14 and parallel resonators P11 through P13. The reception filter 121 includes series resonators S21 through S24 and parallel resonators P21 through P23. The matching circuit 122 includes an inductor L1 connected between the antenna terminal Ant and a ground.

The transmission filter 120 is designed to pass, out of signals input from the transmission terminal Tx, signals within the transmission band to the antenna terminal Ant as transmission signals, and to suppress signals within other frequency bands (e.g. reception band). The reception filter 121 is designed to pass, out of signals input from the antenna terminal Ant, signals within the reception band to the reception terminal Rx as reception signals, and to suppress signals within other frequency bands (e.g. transmission band). The matching circuit 122 is a circuit that performs impedance matching to allow the transmission signal transmitted through the transmission filter 120 not to leak to the reception filter 121 side and to be output from the antenna terminal Ant.

FIG. 8B reveals that the steepness of a cutoff characteristic on a low frequency side of a passband (reception band) of the reception filter 121 is unfavorable. In addition, FIG. 8C reveals that a pass phase greatly varies in a transition band (guard band) between the passband (reception band) of the reception filter 121 and a blocking band on the low frequency side of the passband of the reception filter 121 (transmission band).

The inventor investigates whether it is possible to form a signal path that has an amplitude approximately equal to a pass amplitude of the reception filter 121 illustrated in FIG. 8B and a phase almost opposite to a pass phase of the reception filter 121 illustrated in FIG. 8C in the guard band. This is because if the above described signal path can be formed, the signal path added between the antenna terminal Ant and the reception terminal Rx is considered to cancel out the reception signal in the guard band, and allow the cutoff characteristic on the low frequency side of the passband of the reception filter 121 to be steep. Hereinafter, referred to as a cancel path is a signal path that purposefully generates a signal having an amplitude approximately equal to a pass amplitude of a reception filter and having a phase almost opposite to a pass phase of the reception filter, and a circuit that forms the cancel path is referred to as a cancel circuit.

Figure 9A:
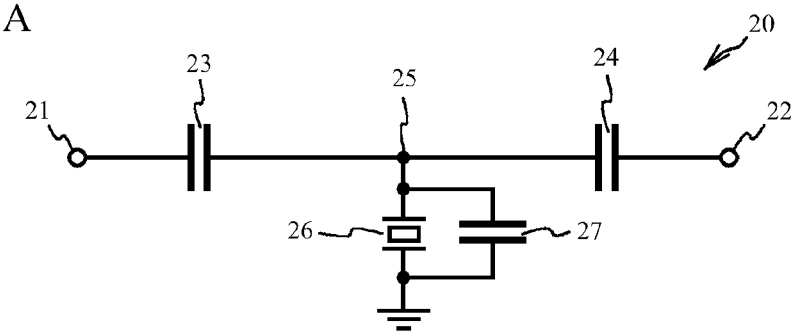
FIG. 9A is a circuit diagram illustrating a cancel circuit.
Figure 9B:
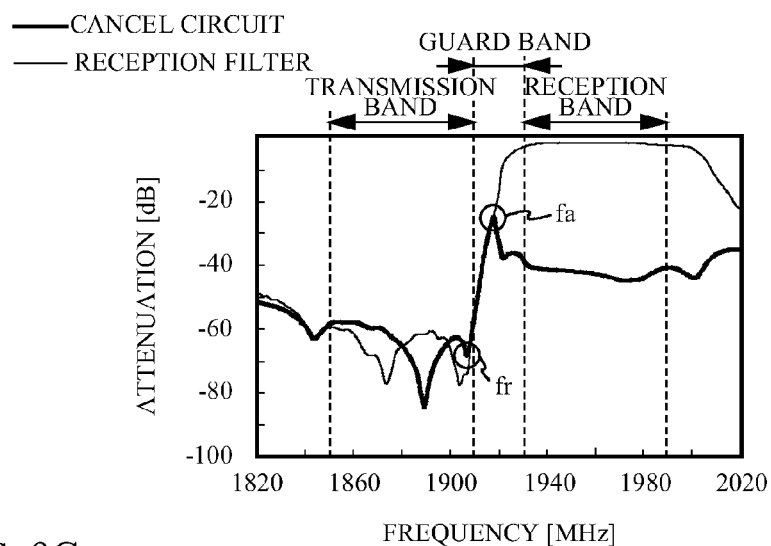
FIG. 9B illustrates simulation results of an amplitude characteristic of a signal transmitted through the cancel circuit.
Figure 9C:
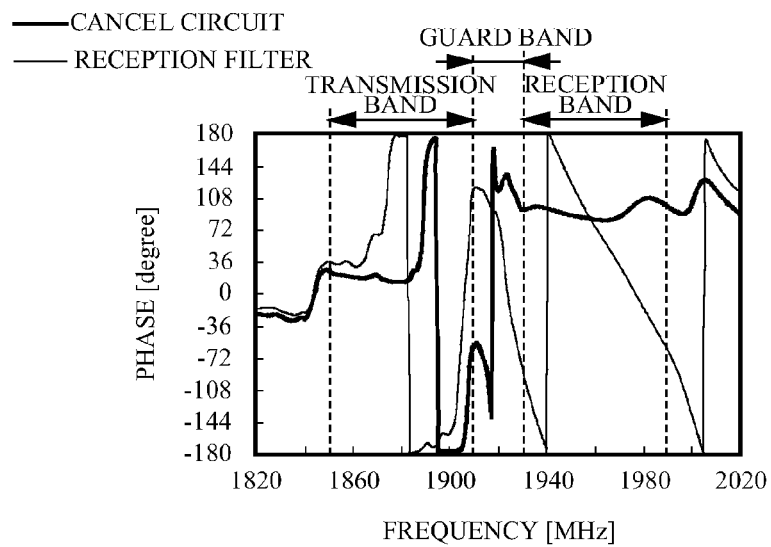
FIG. 9C illustrates simulation results of a phase characteristic.

The inventor's investigation reveals that the above described cancel path can be formed with an acoustic wave resonator. FIG. 9A is a circuit diagram illustrating a cancel circuit, FIG. 9B illustrates simulation results of an amplitude characteristic of a signal transmitted through the cancel circuit, and FIG. 9C illustrates simulation results of a phase characteristic. In FIG. 9B and FIG. 9C, bold lines indicate the amplitude characteristic and the phase characteristic of the signal transmitted through the cancel circuit, and, for comparison, thin lines indicate a pass amplitude characteristic and a pass phase characteristic of the reception filter 121 included in the duplexer of the first comparative example. As illustrated in FIG. 9A, a cancel circuit 20 includes capacitors 23 and 24 connected in series between an input connection portion 21 and an output connection portion 22, a first acoustic wave resonator 26 connected between a node 25, which is between the capacitors 23 and 24, and a ground, and a capacitor 27 connected in parallel to the first acoustic wave resonator 26. The first acoustic wave resonator 26 may be the surface acoustic wave resonator, the Love wave resonator, or the boundary acoustic wave resonator illustrated in FIG. 5A through FIG. 5D, or the piezoelectric thin film resonator illustrated in FIG. 6A and FIG. 6B.

An amplitude and a phase of a signal transmitted through the cancel circuit 20 can be adjusted by controlling a resonance frequency and an anti-resonance frequency of the first acoustic wave resonator 26. That is to say, the first acoustic wave resonator 26 has a central role in making the signal transmitted through the cancel circuit 20 have an amplitude approximately equal to and a phase almost opposite to those of the cutoff characteristic on the low frequency side of the passband of the reception filter. The capacitors 23 and 24 make input/output impedance of the cancel circuit 20 high, and thereby reduce the amount of the signal flowing into the cancel circuit 20. The capacitor 27 makes the amplitude characteristic of the signal transmitted through the cancel circuit 20 match the slope of the cutoff characteristic on the low frequency side of the passband of the reception filter by adjusting a gap between the resonance frequency and the anti-resonance frequency of the first acoustic wave resonator 26.

As illustrated in FIG. 9B, a resonance frequency fr formed by the first acoustic wave resonator 26 and the capacitor 27 is set to a frequency slightly lower than the guard band, and an anti-resonance frequency fa is set to a frequency within the guard band. This setting allows the signal transmitted through the cancel circuit 20 to have an amplitude approximately equal to the pass amplitude of the reception filter 121 in low frequencies within the guard band. Moreover, as illustrated in FIG. 9C, the phase of the signal transmitted through the cancel circuit 20 can be made to be almost opposite to the pass phase of the reception filter 121 in low frequencies within the guard band. Thus, a description will now be given of a duplexer in accordance with the first embodiment that has the above described cancel circuit 20 connected between an antenna terminal and a reception terminal of the duplexer.

Figure 10A:
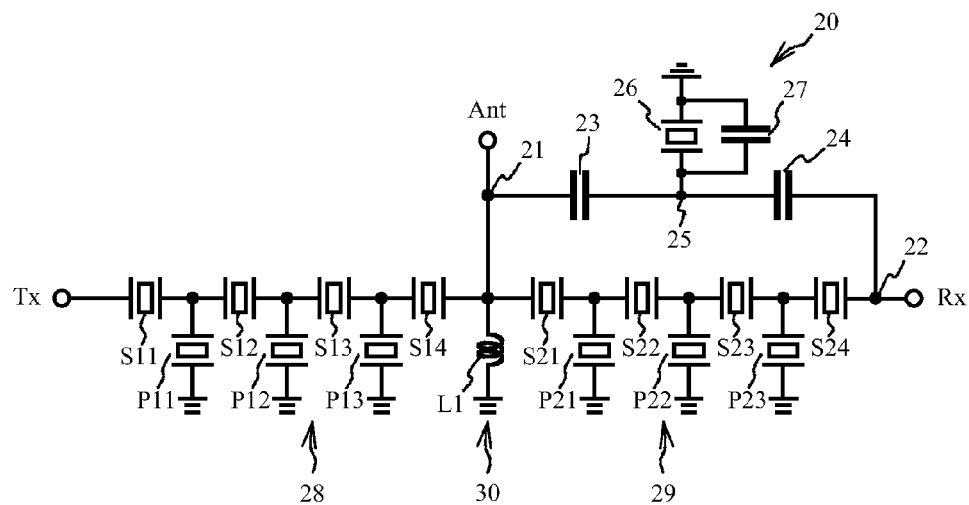
FIG. 10A is a circuit diagram of a duplexer in accordance with a first embodiment.
Figure 10B:
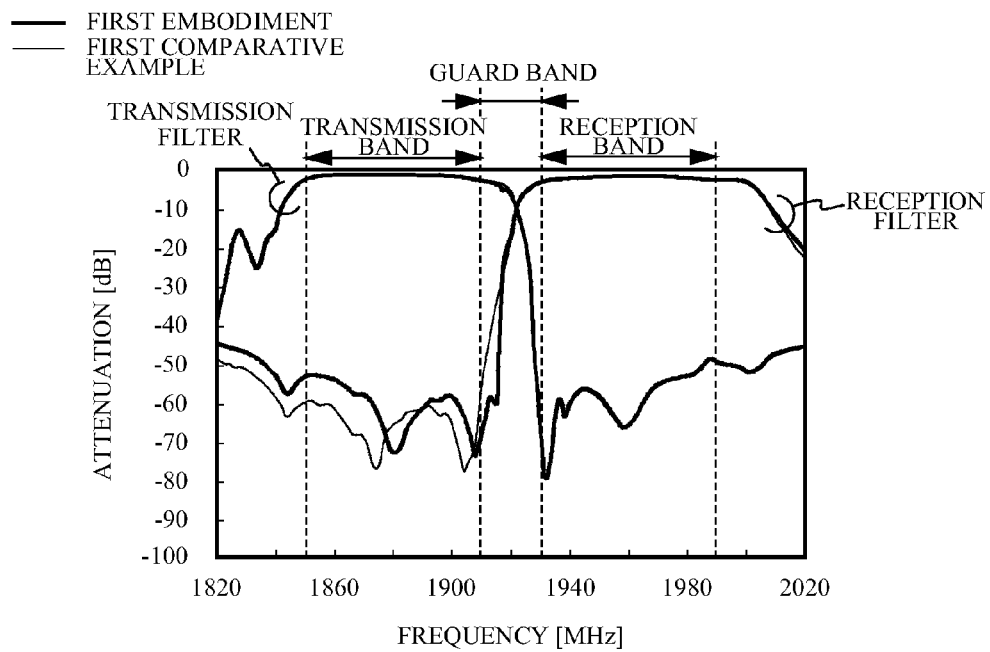
FIG. 10B illustrates simulation results of pass amplitude characteristics of a transmission filter and a reception filter.

FIG. 10A is a circuit diagram of the duplexer in accordance with the first embodiment, and FIG. 10B illustrates simulation results of pass amplitude characteristics of a transmission filter and a reception filter. In FIG. 10B, bold lines indicate the pass amplitude characteristics of the transmission filter and the reception filter included in the duplexer of the first embodiment, and for comparison, thin lines indicate the pass amplitude characteristics of the transmission filter and the reception filter included in the duplexer of the first comparative example. As illustrated in FIG. 10A, the duplexer of the first embodiment includes a transmission filter 28 connected between the antenna terminal Ant and the transmission terminal Tx, a reception filter 29 connected between the antenna terminal Ant and the reception terminal Rx, and a matching circuit 30. The transmission filter 28, the reception filter 29, and the matching circuit 30 have the same configurations as those of the transmission filter 120, the reception filter 121, and the matching circuit 122 of the first comparative example illustrated in FIG. 8A, and thus a description thereof is omitted.

The input connection portion 21 of the cancel circuit 20 is coupled to a node between the series resonator S21, which is located closest to the antenna terminal Ant among the resonators of the reception filter 29, and the antenna terminal Ant. The output connection portion 22 of the cancel circuit 20 is coupled to a node between the series resonator S24, which is located closest to the reception terminal Rx among the resonators of the reception filter 29, and the reception terminal Rx. This configuration allows the cancel circuit 20 to be connected in parallel to the reception filter 29 between the antenna terminal Ant and the reception terminal Rx. The cancel circuit 20 has the same configuration as the one illustrated in FIG. 9A, and thus a description thereof is omitted.

As described for FIG. 9B and FIG. 9C, the resonance frequency fr formed by the first acoustic wave resonator 26 and the capacitor 27 of the cancel circuit 20 is set to a frequency slightly lower than the guard band, and the anti-resonance frequency fa is set to a frequency within the guard band. This setting allows the signal transmitted through the cancel circuit 20 to have an amplitude approximately equal to a pass amplitude of the reception filter 29 and a phase almost opposite to a pass phase of the reception filter 29 in low frequencies within the guard band. Therefore, as illustrated in FIG. 10B, the reception signal in the guard band of the reception filter 29 can be canceled out by the signal transmitted through the cancel circuit 20, and accordingly the cutoff characteristic on the low frequency side of the passband of the reception filter 29 can be made steep.

As illustrated in FIG. 10B, the transmission filter and the reception filter of the first embodiment have almost the same insertion loss and passband widths as those of the first comparative example. That is to say, the connection of the cancel circuit 20 hardly changes the insertion loss and the passband width. The reason why the insertion loss hardly changes is because the capacitors 23 and 24 are connected in series between the input connection portion 21 and output connection portion 22 of the cancel circuit 20 and thus the amount of the signal flowing into the cancel circuit 20 is reduced. Therefore, capacitances of the capacitors 23 and 24 are preferably determined taking into account the amount of the signal flowing into the cancel circuit 20. In addition, the reason why the passband width hardly changes is because only the low frequencies within the guard band satisfy a cancel condition under which the signals transmitted through the reception filter 29 and the cancel circuit 20 cancel out each other, and other frequencies fail to satisfy the cancel condition. Therefore, change in a filter characteristic that changes the passband width is not caused.

As described above, the first embodiment configures the connection of the input connection portion 21 and output connection portion 22 of the cancel circuit 20 so that the cancel circuit 20 is connected in parallel to at least a part of the resonators constituting the reception filter 29. The cancel circuit 20 includes the first acoustic wave resonator 26 connected between the node 25, which is between the input connection portion 21 and the output connection portion 22, and a ground. The above configuration can suppress an increase in loss in the passband and a reduction in the passband width, and make the cutoff characteristic on the low frequency side of the passband of the reception filter 29 steep as illustrated in FIG. 10B by properly setting the resonance frequency and anti-resonance frequency of the first acoustic wave resonator 26.

To make the cutoff characteristic on the low frequency side of the passband of the reception filter 29 steep, the resonance frequency fr and anti-resonance frequency fa of the first acoustic wave resonator 26 are preferably set so that the signal transmitted through the cancel circuit 20 has an amplitude approximately equal to and a phase almost opposite to those of the cutoff characteristic on the low frequency side of the passband of the reception filter 29. For example, as described for FIG. 9B, the resonance frequency fr of the first acoustic wave resonator 26 is preferably set to a frequency within the transition band (guard band) or a frequency lower than the transition band (guard band). The anti-resonance frequency fa is preferably set to a frequency within the transition band (guard band).

The configuration of the cancel circuit is not limited to the one illustrated in FIG. 9A. FIG. 11A through FIG. 11E are circuit diagrams illustrating first through sixth variations of the cancel circuit. The first variation illustrated in FIG. 11A demonstrates that a capacitor may fail to be connected between the node 25 and the output connection portion 22. The second variation illustrated in FIG. 11B demonstrates that a capacitor may be connected neither between the node 25 and the input connection portion 21 nor between the node 25 and the output connection portion 22. However, a capacitor is preferably connected in series between the input connection portion 21 and the output connection portion 22 as illustrated in FIG. 9A to reduce the amount of the signal flowing into the cancel circuit 20. Especially, capacitors are more preferably connected in series both between the node 25 and the input connection portion 21 and between the node 25 and the output connection portion 22.

Figure 11A:
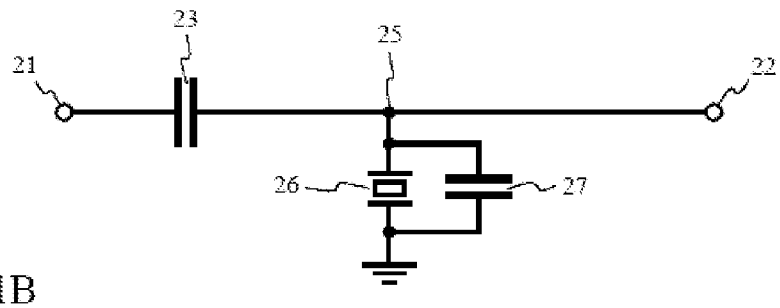
FIG. 11A through FIG. 11E are circuit diagrams illustrating first through sixth variations of a cancel circuit.
Figure 11B:
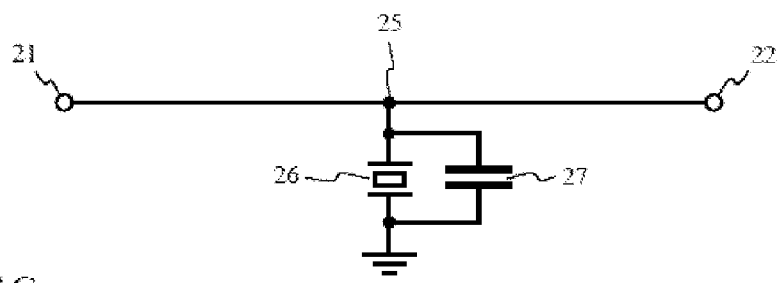
Figure 11C:
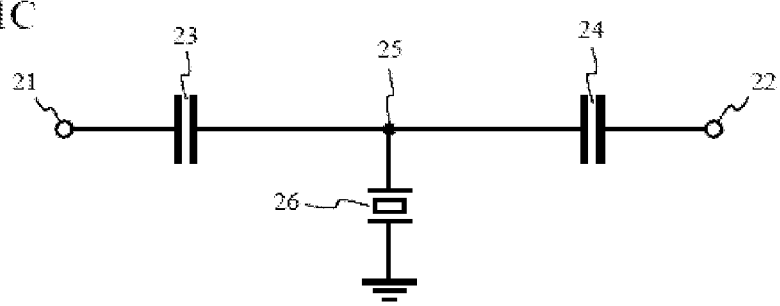

The third variation illustrated in FIG. 11C demonstrates that a capacitor may fail to be connected in parallel to the first acoustic wave resonator 26. However, a capacitor is preferably connected in parallel to the first acoustic wave resonator 26 as illustrated in FIG. 9A to make the amplitude characteristic of the signal transmitted through the cancel circuit 20 match the slope of the cutoff characteristic on the low frequency side of the passband of the reception filter.

Figure 11D:
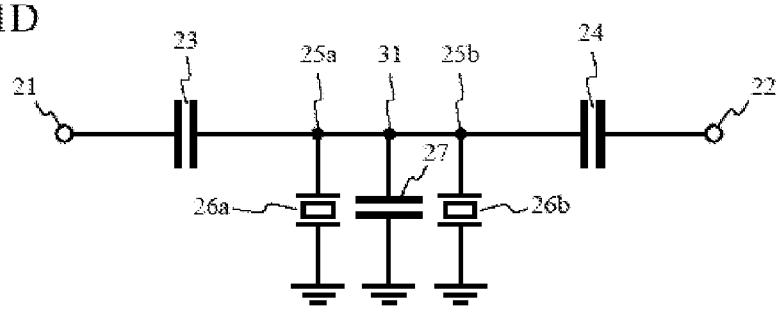
Figure 11E:
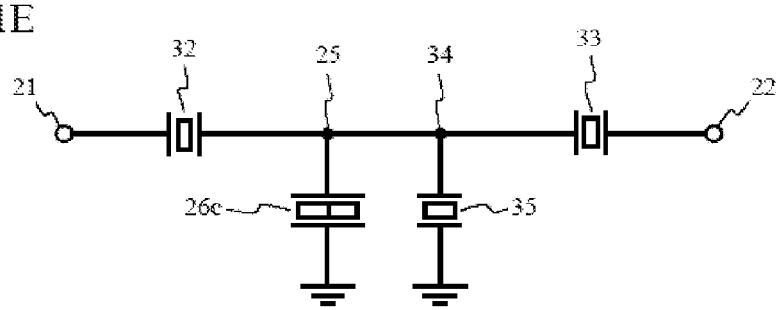

The fourth variation illustrated in FIG. 11D demonstrates that a first acoustic wave resonator 26a may be connected between a node 25a, which is between the input connection portion 21 and the output connection portion 22, and a ground, a second acoustic wave resonator 26b may be connected between a node 25b and a ground, and the capacitor 27 may be connected between a node 31 and a ground. That is to say, two or more first acoustic wave resonators may be connected. The first acoustic wave resonators may have mutually equal resonance frequencies or mutually different resonance frequencies. The fifth variation illustrated in FIG. 11E demonstrates that capacitors connected in series between the input connection portion 21 and the output connection portion 22 may be acoustic wave resonators 32 and 33, and a capacitor connected in parallel to a first acoustic wave resonator 26c may be an acoustic wave resonator 35 connected between a node 34 and a ground. In addition, the first acoustic wave resonator 26c may be designed to have two or more resonance frequencies.

Figure 12A:
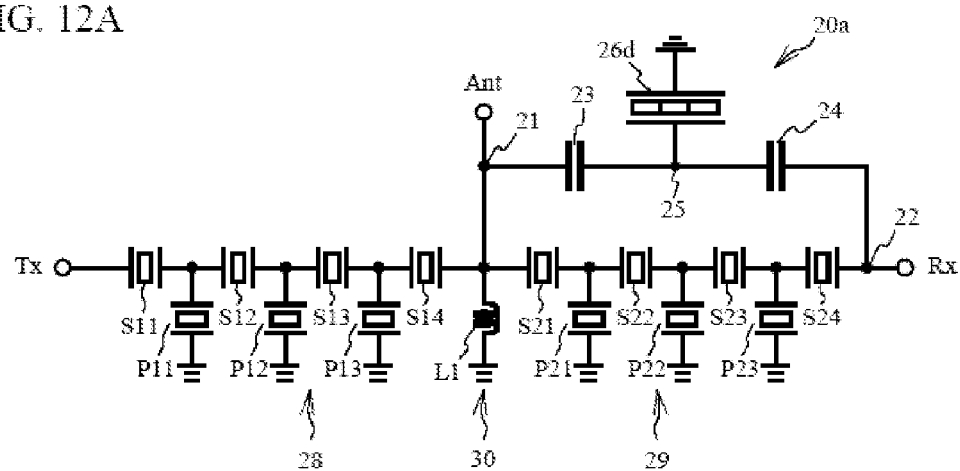
FIG. 12A is a circuit diagram of a duplexer in accordance with a first variation of the first embodiment.
Figure 12B:
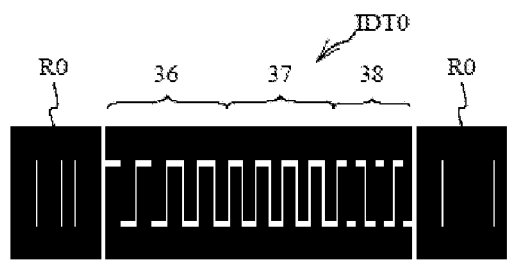
FIG. 12B is a plan view of a first acoustic wave resonator.
Figure 12C:
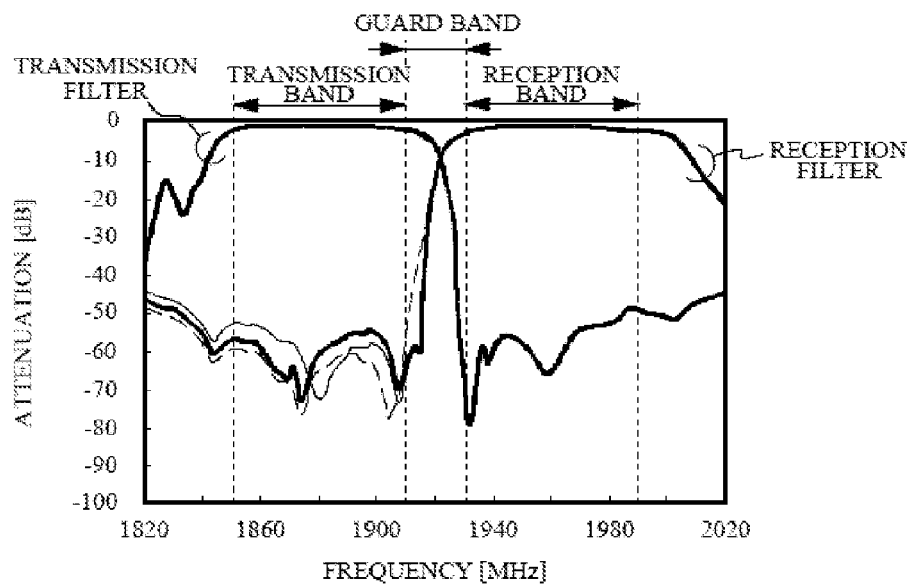
FIG. 12C illustrates simulation results of pass amplitude characteristics of a transmission filter and a reception filter.

Here, a description will be given of an advantage obtained by designing a first acoustic wave resonator to have two or more resonance frequencies. FIG. 12A is a circuit diagram of a duplexer in accordance with a first variation of the first embodiment, FIG. 12B is a plan view of a first acoustic wave resonator, and FIG. 12C illustrates simulation results of pass amplitude characteristics of a transmission filter and a reception filter. In FIG. 12C, bold solid lines indicate pass amplitude characteristics of the transmission filter and the reception filter in the duplexer of the first variation of the first embodiment, and for comparison, thin solid lines indicate the pass amplitude characteristics of the transmission filter and the reception filter in the duplexer of the first embodiment, and thin dashed lines indicate the pass amplitude characteristics of those of the first comparative example.

As illustrated in FIG. 12A, a cancel circuit 20a is connected in parallel to the reception filter 29 between the antenna terminal Ant and the reception terminal Rx. The cancel circuit 20a includes the capacitors 23 and 24 connected in series between the input connection portion 21 and the output connection portion 22, and a first acoustic wave resonator 26d connected between the node 25 and a ground. Other configurations are the same as those of the first embodiment illustrated in FIG. 10A, and thus a description thereof is omitted.

As illustrated in FIG. 12B, the first acoustic wave resonator 26d has the IDT0 between the reflectors R0. The IDT0 has three regions 36, 37, and 38 including comb-shaped electrodes having different periods and widths of electrode fingers. When a resonance frequency in the region 38 out of the three regions is set sufficiently high compared to the passband of the reception filter 29, the comb-shaped electrodes in the region 38 function as a capacitor. This enables to omit the capacitor 27 illustrated in FIG. 9A, and to downsize the cancel circuit. Resonance frequencies in the regions 36 and 37 differ from each other, and are set to frequencies lower than the guard band.

As illustrated in FIG. 12C, the first variation of the first embodiment has a cutoff characteristic on the low frequency side of the passband of the reception filter 29 with steepness almost the same as that of the first embodiment. However, the first variation of the first embodiment further improves the degree of suppression in the blocking band on the low frequency side of the passband of the reception filter 29 (transmission band) compared to the first embodiment. This is because the first acoustic wave resonator 26d has two or more resonance frequencies, and accordingly the resonance frequency of the first acoustic wave resonator 26d can be set to frequencies slightly lower and further lower than the guard band. As described above, when the first acoustic wave resonator 26d has two or more resonance frequencies, resonance frequencies can be set to arbitrary points within the blocking band (transmission band), and accordingly, the cutoff characteristic on the low frequency side of the passband of the reception filter 29 can be made steep and the degree of suppression can be improved by controlling a suppression characteristic in the blocking band (transmission band). Therefore, as illustrated in FIG. 11D, when two or more first acoustic wave resonators are connected, the first acoustic wave resonators preferably have mutually different resonance frequencies.

Figure 13A:
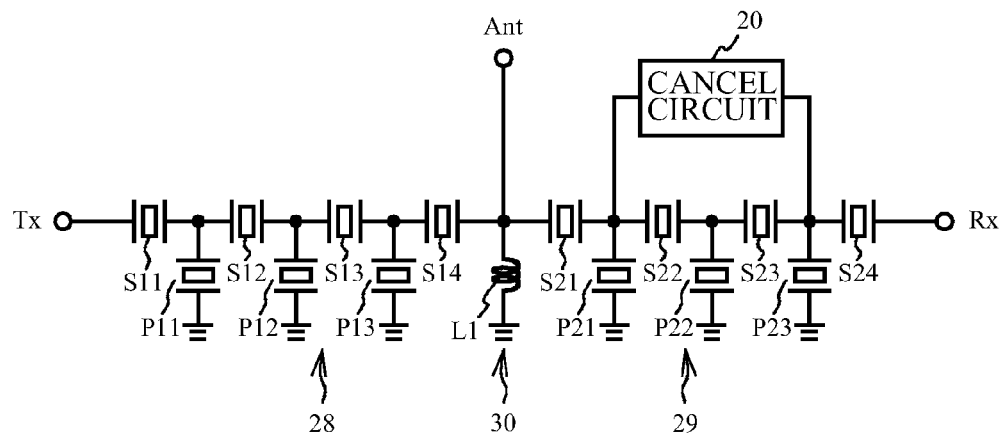
FIG. 13A and FIG. 13B are diagrams illustrating connection examples of the cancel circuit.
Figure 13B:
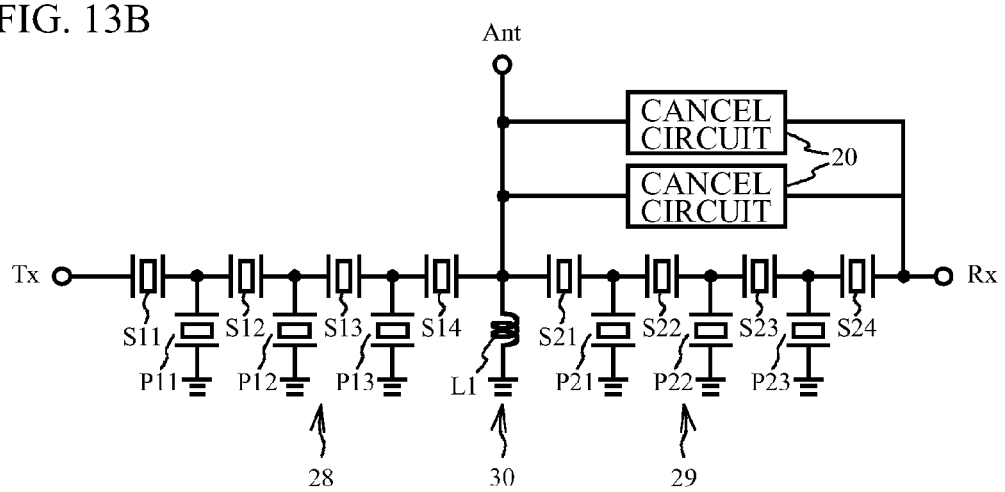

The first embodiment connects the cancel circuit 20 between the antenna terminal Ant (input terminal) and the reception terminal Rx (output terminal) as illustrated in FIG. 10A, but does not intend to suggest any limitation. FIG. 13A and FIG. 13B illustrate connection examples of the cancel circuit. As illustrated in FIG. 13A, the cancel circuit 20 may be connected between an arbitrary node and another arbitrary node in the reception filter 29. As illustrated in FIG. 13B, two or more cancel circuits 20 may be connected in parallel between the antenna terminal Ant and the reception terminal Rx.

Second Embodiment

Figure 14A:
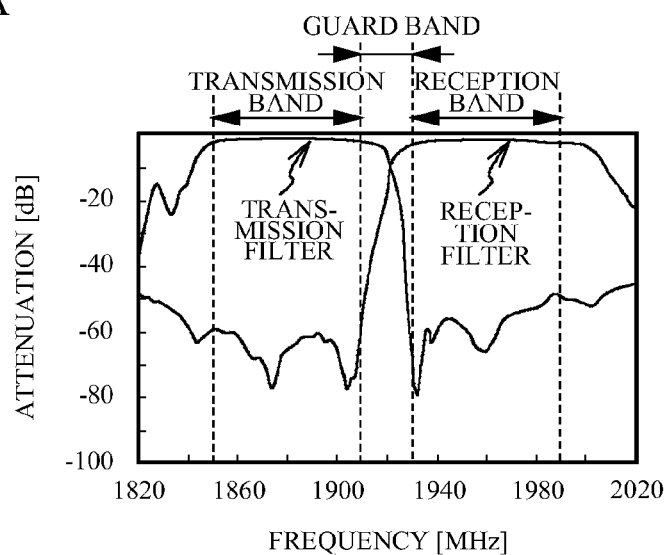
FIG. 14A illustrates simulation results of the pass amplitude characteristics of the transmission filter and the reception filter in the duplexer of the first comparative example.
Figure 14B:
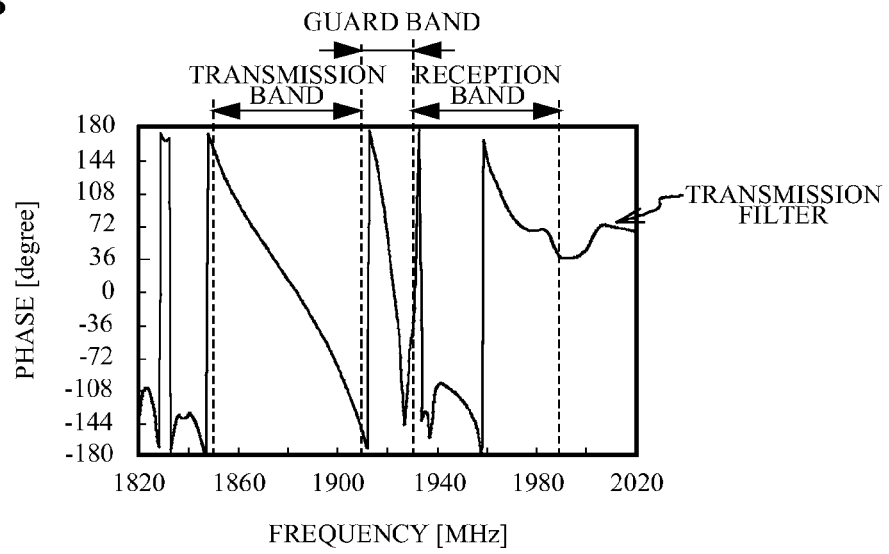
FIG. 14B illustrates simulation results of a pass phase characteristic of the transmission filter in the duplexer of the first comparative example.

A second embodiment improves a degree of suppression in a blocking band on a high frequency side of a passband of a filter. FIG. 14A illustrates simulation results of the pass amplitude characteristics of the transmission filter and the reception filter in the duplexer of the first comparative example illustrated in FIG. 8A, and FIG. 14B illustrates simulation results of a pass phase characteristic of the transmission filter in the duplexer of the first comparative example illustrated in FIG. 8A. FIG. 14A reveals that the degree of suppression in a blocking band (reception band) on a high frequency side of the passband of the transmission filter 120 is unfavorable. Moreover, FIG. 14B reveals that the pass phase of the transmission filter 120 greatly varies in the reception band.

The inventor investigates whether it is possible to form a signal path that has an amplitude approximately equal to a pass amplitude of the transmission filter 120 illustrated in FIG. 14A and a phase almost opposite to a pass phase of the transmission filter 120 illustrated in FIG. 14B. This is because, taking into account the first embodiment, the above described signal path added between the antenna terminal Ant and the transmission terminal Tx is considered to cancel out the transmission signal in the reception band, and improve the degree of suppression of the transmission filter 120 in the reception band. The second embodiment describes a signal path that purposefully generates a signal that has an amplitude approximately equal to a pass amplitude of a transmission filter and a phase almost opposite to a pass phase of the transmission filter in the reception band as a cancel path, and a circuit that forms the cancel path as a cancel circuit.

Figure 15A:
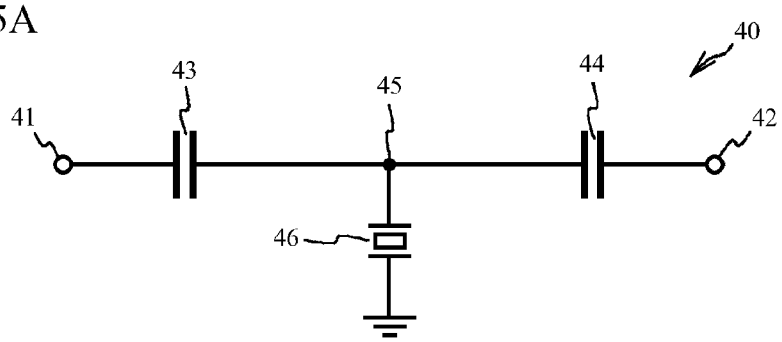
FIG. 15A is a circuit diagram illustrating a cancel circuit.
Figure 15B:
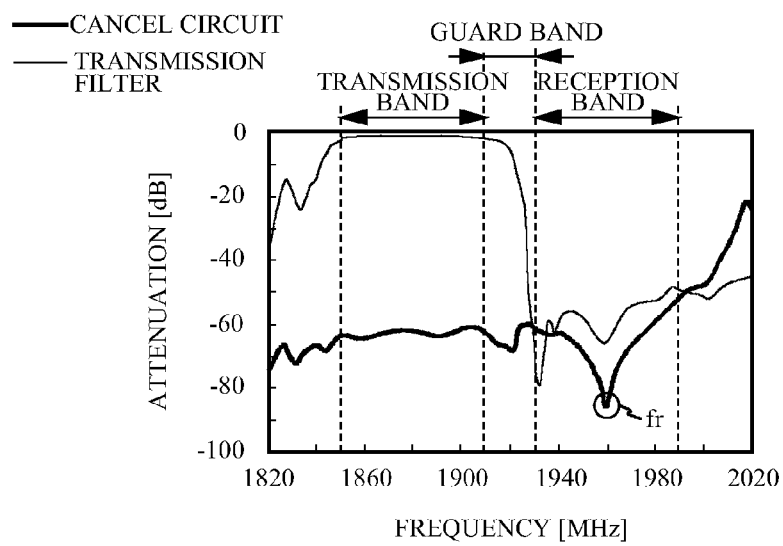
FIG. 15B illustrates simulation results of an amplitude characteristic of a signal transmitted through the cancel circuit.
Figure 15C:
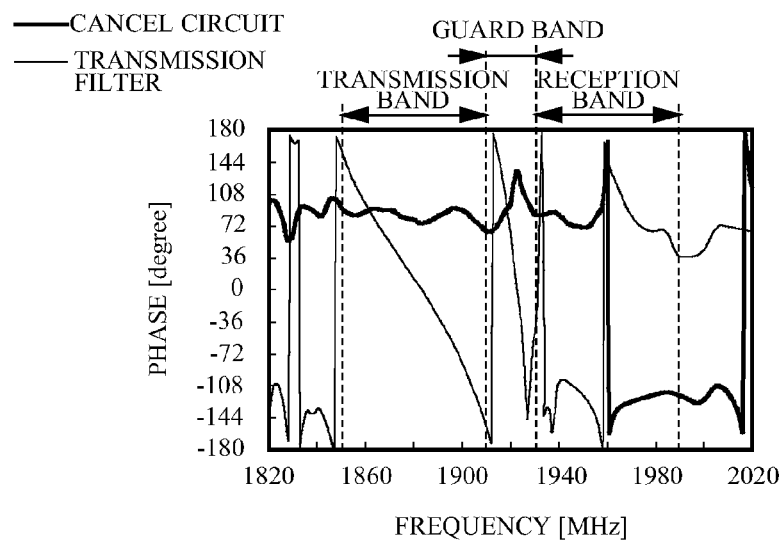
FIG. 15C illustrates simulation results of a phase characteristic.

The inventor's investigation reveals that the above described cancel path can be formed with an acoustic wave resonator. FIG. 15A is a circuit diagram of an exemplary cancel circuit, FIG. 15B illustrates simulation results of an amplitude characteristic of a signal transmitted through the cancel circuit, and FIG. 15C illustrates simulation results of a phase characteristic. In FIG. 15B and FIG. 15C, bold lines indicate the amplitude characteristic and phase characteristic of the signal transmitted through the cancel circuit, and for comparison, thin lines indicate the pass amplitude characteristic and pass phase characteristic of the transmission filter 120 in the duplexer of the first comparative example. As illustrated in FIG. 15A, a cancel circuit 40 includes capacitors 43 and 44 connected in series between an input connection portion 41 and an output connection portion 42, and a first acoustic wave resonator 46 connected between a node 45, which is between the capacitors 43 and 44, and a ground.

The first acoustic wave resonator 46 makes the signal transmitted through the cancel circuit 40 have an amplitude approximately equal to a pass amplitude of a transmission filter and a phase almost opposite to a pass phase of the transmission filter in the reception band. The capacitors 43 and 44 make input/output impedance of the cancel circuit 40 high, and thereby reduce the amount of the signal flowing into the cancel circuit 40.

As illustrated in FIG. 15B and FIG. 15C, a resonance frequency fr of the first acoustic wave resonator 46 is set to around a frequency that is within the reception band and at which the pass phase of the transmission filter 120 reverses. That is to say, the resonance frequency fr of the first acoustic wave resonator 46 is set to around anti-resonance frequencies of the series resonators S21 through S24 constituting the transmission filter 120. This allows the signal transmitted through the cancel circuit 40 to have an amplitude approximately equal to the pass amplitude of the transmission filter 120 in the reception band. In addition, the signal transmitted through the cancel circuit 40 can be made to have a phase almost opposite to the pass phase of the transmission filter 120 in the reception band. Thus, a description will be given of a duplexer in accordance with the second embodiment that connects the above described cancel circuit 40 between an antenna terminal and a transmission terminal in the duplexer.

Figure 16A:
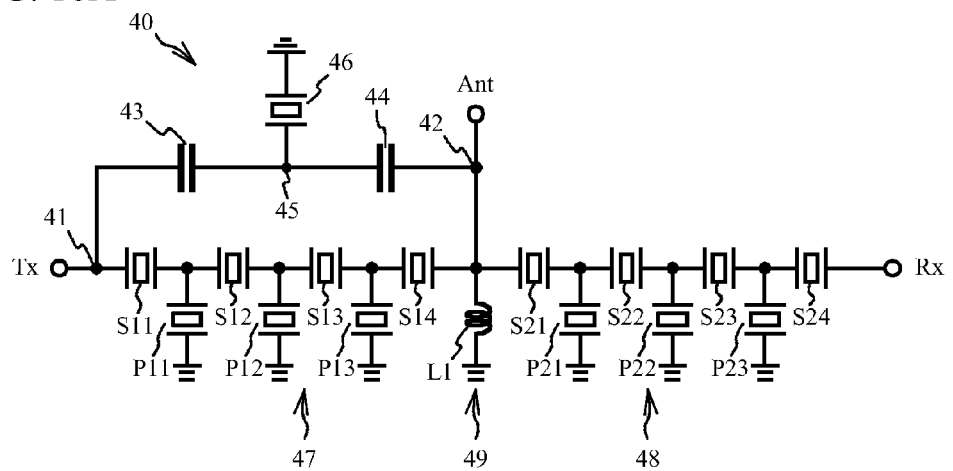
FIG. 16A is a circuit diagram of a duplexer in accordance with a second embodiment.
Figure 16B:
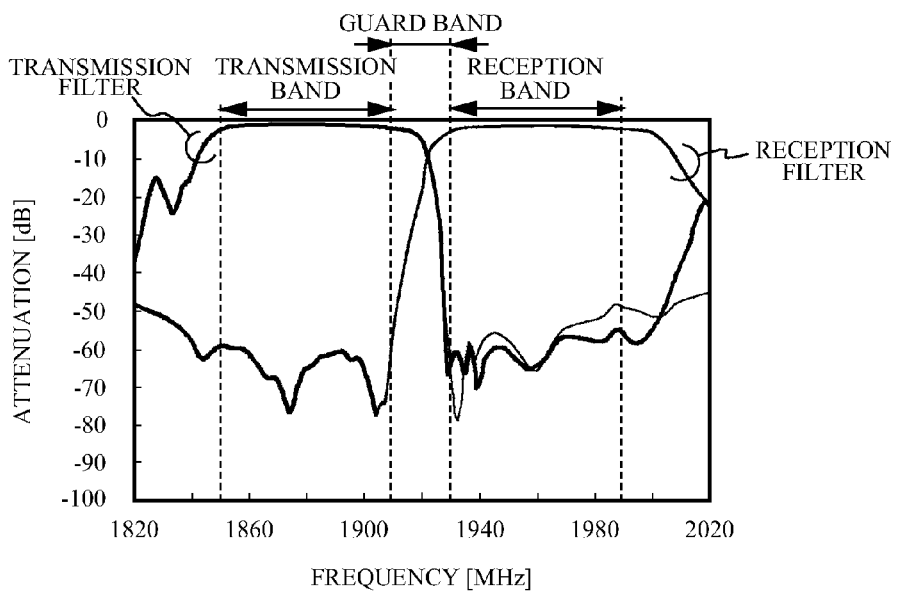
FIG. 16B illustrates simulation results of pass amplitude characteristics of a transmission filter and a reception filter.

FIG. 16A is a circuit diagram of the duplexer in accordance with the second embodiment, and FIG. 16B illustrates simulation results of pass amplitude characteristics of a transmission filter and a reception filter. In FIG. 16B, bold lines indicate the pass amplitude characteristics of the transmission filter and the reception filter in the duplexer of the second embodiment, and for comparison, thin lines indicate the pass amplitude characteristics of the transmission filter and the reception filter in the duplexer of the first comparative example. As illustrated in FIG. 16A, the duplexer of the second embodiment includes a transmission filter 47 connected between the antenna terminal Ant and the transmission terminal Tx, a reception filter 48 connected between the antenna terminal Ant and the reception terminal Rx, and a matching circuit 49. The transmission filter 47, the reception filter 48, and the matching circuit 49 have the same configurations as those of the transmission filter 120, the reception filter 121, and the matching circuit 122 of the first comparative example illustrated in FIG. 8A, respectively, and thus a description thereof is omitted.

The input connection portion 41 of the cancel circuit 40 is connected to a node between the series resonator S11, which is located closest to the transmission terminal Tx among the resonators of the transmission filter 47, and the transmission terminal Tx. The output connection portion 42 of the cancel circuit 40 is connected to a node between the series resonator S14, which is located closest to the antenna terminal Ant among the resonators of the transmission filter 47, and the antenna terminal Ant. The above configuration allows the cancel circuit 40 to be connected in parallel to the transmission filter 47 between the antenna terminal Ant and the transmission terminal Tx. The cancel circuit 40 has the same configuration as the one illustrated in FIG. 15A, and thus a description thereof is omitted.

As described for FIG. 15B and FIG. 15C, the resonance frequency fr of the first acoustic wave resonator 46 in the cancel circuit 40 is set to around a frequency that is within the reception band and at which the pass phase of the transmission filter 47 reverses. This setting allows the signal transmitted through the cancel circuit 40 to have an amplitude approximately equal to the pass amplitude of the transmission filter 47 and a phase almost opposite to the pass phase of the transmission filter 47 in the reception band. Therefore, as illustrated in FIG. 16B, the transmission signal in the reception band can be canceled out by the signal transmitted through the cancel circuit 40, and the degree of suppression of the transmission filter 47 in the reception band can be improved.

In addition, an increase in insertion loss of the transmission filter 47 is suppressed because the capacitors 43 and 44 are connected in series between the input connection portion 41 and the output connection portion 42 of the cancel circuit 40. Moreover, only the frequencies near the reception band satisfy a cancel condition under which the signals transmitted through the transmission filter 47 and the cancel circuit 40 cancel out each other, and other frequencies fail to satisfy the cancel condition. Thus, the change in the filter characteristic that changes the passband width is not caused. Therefore, the reduction in the passband width of the transmission filter 47 is suppressed.

The second embodiment configures the connection of the input connection portion 41 and the output connection portion 42 of the cancel circuit 40 so that the cancel circuit 40 is connected in parallel to a part of the resonators constituting the transmission filter 47 as illustrated in FIG. 16A. The cancel circuit 40 includes the first acoustic wave resonator 46 connected between the node 45, which is between the input connection portion 41 and the output connection portion 42, and a ground. The above configuration enables to suppress an increase in loss in the passband and a reduction in the passband width, and to improve the degree of suppression in the blocking band on the high frequency side of the passband of the transmission filter 47 (i.e. reception band) as illustrated in FIG. 16B by properly setting the resonance frequency of the first acoustic wave resonator 46.

To improve the degree of suppression in the blocking band on the high frequency side of the passband of the transmission filter 47 (i.e. reception band), the resonance frequency of the first acoustic wave resonator 46 is preferably set so that the signal transmitted through the cancel circuit 40 has an amplitude approximately equal to the pass amplitude of the transmission filter 47 and a phase almost opposite to and the pass phase of the transmission filter 47 in the blocking band on the high frequency side of the passband of the transmission filter 47 (i.e. reception band). For example, as described for FIG. 15B, the resonance frequency of the first acoustic wave resonator 46 is preferably set to a frequency within the blocking band on the high frequency side of the passband of the transmission filter 47 (reception band). Especially, the resonance frequency of the first acoustic wave resonator 46 is more preferably set to around a frequency that is within the blocking band (reception band) and at which the pass phase of the transmission filter 47 reverses.

Figure 17A:
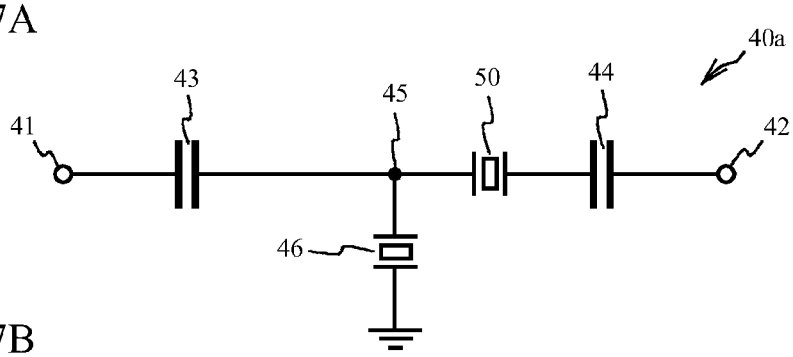
FIG. 17A is a circuit diagram illustrating another cancel circuit.
Figure 17B:
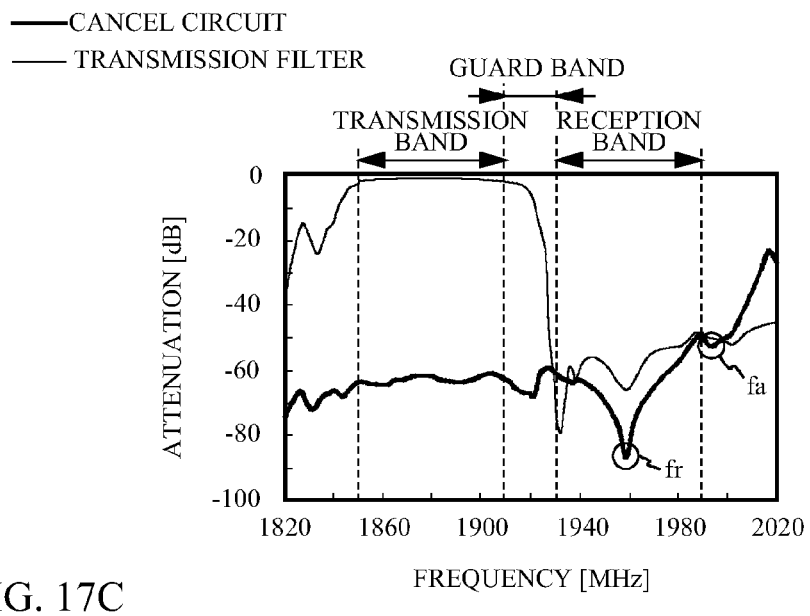
FIG. 17B illustrates simulation results of an amplitude characteristic of a signal transmitted through the cancel circuit.
Figure 17C:
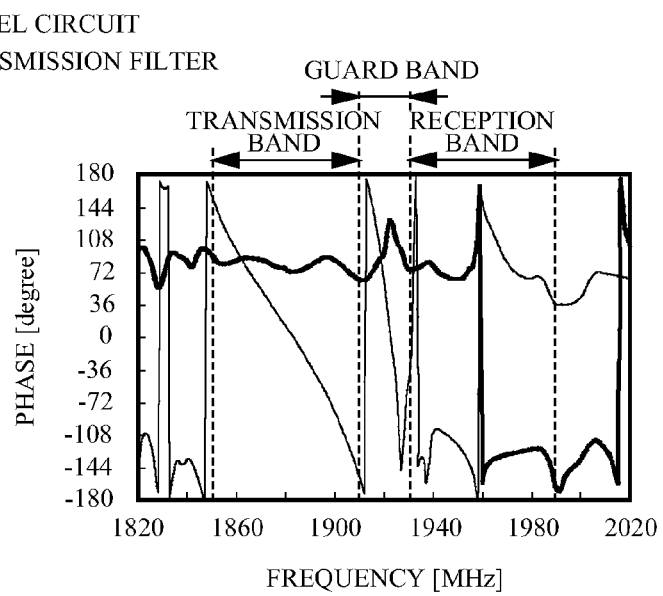
FIG. 17C illustrates simulation results of a phase characteristic.

FIG. 17A is a circuit diagram illustrating another cancel circuit, FIG. 17B illustrates simulation results of an amplitude characteristic of a signal transmitted through the cancel circuit, and FIG. 17C illustrates simulation results of a phase characteristic. In FIG. 17B and FIG. 17C, bold lines indicate the amplitude characteristic and the phase characteristic of the signal transmitted through the cancel circuit, and for comparison, thin lines indicate the pass amplitude characteristic and the pass phase characteristic of the transmission filter 120 in the duplexer of the first comparative example. As illustrated in FIG. 17A, a cancel circuit 40a includes a second acoustic wave resonator 50 connected in series between the node 45 and the capacitor 44. Other configurations are the same as those of the cancel circuit illustrated in FIG. 15A, and thus a description thereof is omitted.

As illustrated in FIG. 17B and FIG. 17C, the resonance frequency fr of the first acoustic wave resonator 46 is set to around a frequency that is within the reception band and at which the pass phase of the transmission filter 120 reverses. An anti-resonance frequency fa of the second acoustic wave resonator 50 is set to a frequency near an upper end of the reception band. A description will now be given of a duplexer in accordance with a first variation of the second embodiment that connects the above described cancel circuit 40a between an antenna terminal and a transmission terminal in the duplexer.

Figure 18A:
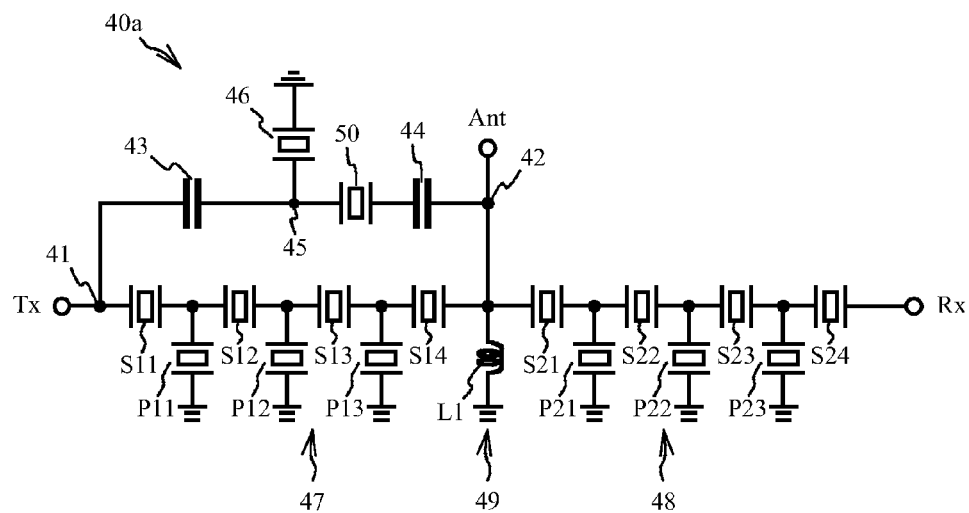
FIG. 18A is a circuit diagram of a duplexer in accordance with a first variation of the second embodiment.
Figure 18B:
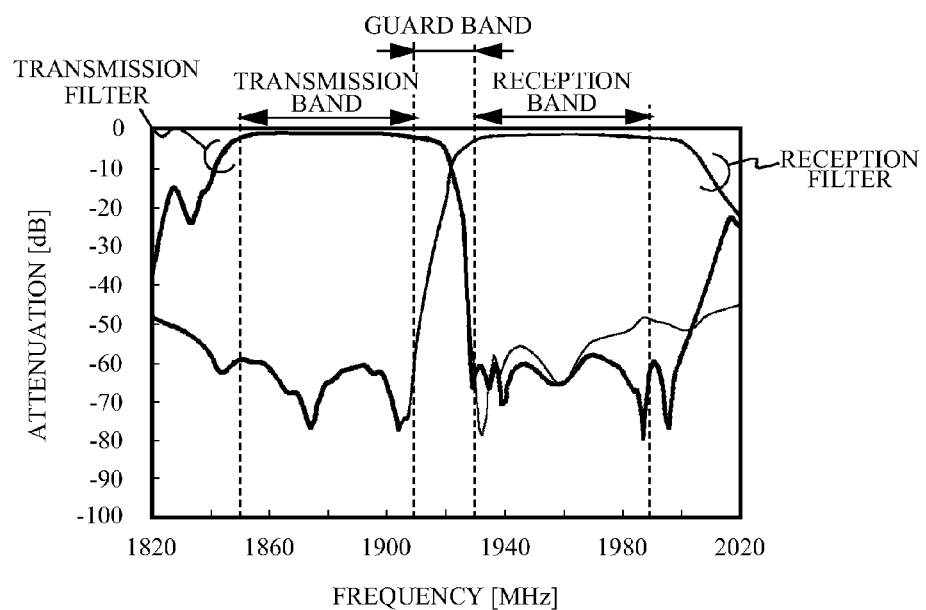
FIG. 18B illustrates simulation results of pass amplitude characteristics of a transmission filter and a reception filter.

FIG. 18A is a circuit diagram of the duplexer in accordance with the first variation of the second embodiment, and FIG. 18B illustrates simulation results of pass amplitude characteristics of a transmission filter and a reception filter. In FIG. 18B, bold lines indicate pass amplitude characteristics of the transmission filter and the reception filter in the duplexer of the first variation of the second embodiment, and for comparison, thin lines indicate the pass amplitude characteristics of the transmission filter and the reception filter in the duplexer of the first comparative example. As illustrated in FIG. 18A, the cancel circuit 40a is connected in parallel to the transmission filter 47 between the antenna terminal Ant and the transmission terminal Tx. Other configurations are the same as those of the second embodiment illustrated in FIG. 16A, and thus a description thereof is omitted.

As described for FIG. 17B and FIG. 17C, the resonance frequency fr of the first acoustic wave resonator 46 is set to around a frequency that is within the reception band and at which the pass phase of the transmission filter 47 reverses. The anti-resonance frequency fa of the second acoustic wave resonator 50 is set to a frequency near the upper end of the reception band. The connection of the cancel circuit 40a including the above described first acoustic wave resonator 46 and second acoustic wave resonator 50 allows the degree of suppression of the transmission filter 47 in the reception band to be improved as illustrated in FIG. 18B compared to FIG. 16B of the second embodiment.

As illustrated in FIG. 17A, the cancel circuit 40a includes the second acoustic wave resonator 50 connected in series between the input connection portion 41 and the output connection portion 42 in addition to the first acoustic wave resonator 46 in the first variation of the second embodiment. The above described configuration enables to further improve the degree of suppression in the blocking band on the high frequency side of the passband of the transmission filter 47 (i.e. reception band) as illustrated in FIG. 18B by properly setting the anti-resonance frequency of the second acoustic wave resonator 50. The anti-resonance frequency of the second acoustic wave resonator 50 may be set to a frequency near the upper end of the blocking band on the high frequency side of the passband of the transmission filter 47 (i.e. reception band) for example.

The second embodiment connects the cancel circuit 40 between the transmission terminal Tx (input terminal) and the antenna terminal Ant (output terminal) as illustrated in FIG. 16A, but does not intend to suggest any limitation. The second embodiment may connect the cancel circuit 40 between an arbitrary node and another arbitrary node in the transmission filter 47 in the same manner illustrated in FIG. 13A and FIG. 13B of the first embodiment. Two or more cancel circuits 40 may be connected between the transmission terminal Tx and the antenna terminal Ant.

Figure 19:
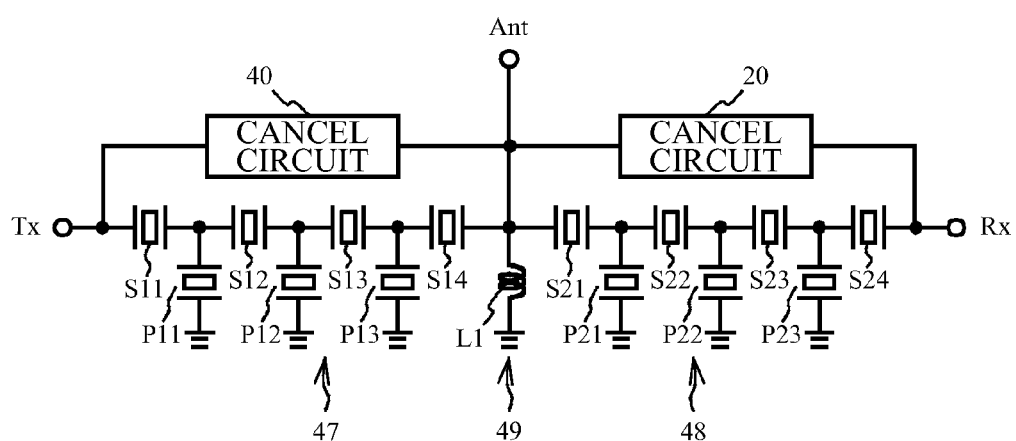
FIG. 19 is a diagram illustrating the duplexer of the second embodiment to which the cancel circuit of the first embodiment is connected.

In addition, the cancel circuit 20 described in the first embodiment may be further connected to the duplexer to which the cancel circuit 40 has been connected. FIG. 19 is a diagram illustrating the duplexer of the second embodiment to which the cancel circuit 20 of the first embodiment is additionally connected. As illustrated in FIG. 19, the cancel circuit 40 is connected between the antenna terminal Ant and the transmission terminal Tx, and the cancel circuit 20 of the first embodiment is further connected between the antenna terminal Ant and the reception terminal Rx. This configuration enables to improve the degree of suppression in the blocking band on the high frequency side of the passband of the transmission filter 47 (i.e. reception band), and to improve the steepness of the cutoff characteristic on the low frequency side of the passband of the reception filter 48.

Furthermore, the first acoustic wave resonator 46 may have two or more resonance frequencies as described in FIG. 12A. In this case, the degree of suppression can be further improved in the blocking band on the high frequency side of the passband of the transmission filter 47 (i.e. reception band).

Third Embodiment

A third embodiment improves a degree of suppression in a blocking band on a low frequency side of a passband of a filter. The third embodiment aims to improve a degree of suppression in the blocking band on the low frequency side of the passband of the reception filter 121 (i.e. transmission band) in FIG. 14A. In this case, as the second embodiment is considered, a signal path is formed so as to have an amplitude approximately equal to the pass amplitude of the reception filter 121 and a phase almost opposite to the pass phase of the reception filter 121 in the transmission band, and is connected between the antenna terminal Ant and the reception terminal Rx. The third embodiment describes a signal path that purposefully generates a signal that has an amplitude approximately equal to a pass amplitude of a reception filter and a phase almost opposite to a pass phase of the reception filter in the transmission band as a cancel path, and a circuit that forms the cancel path as a cancel circuit.

Figure 20A:
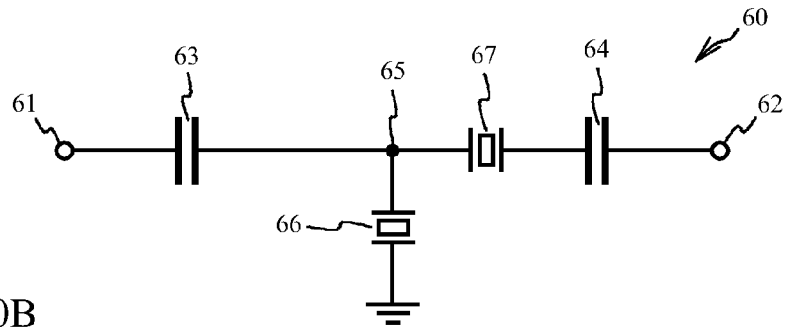
FIG. 20A is a circuit diagram illustrating a cancel circuit.
Figure 20B:
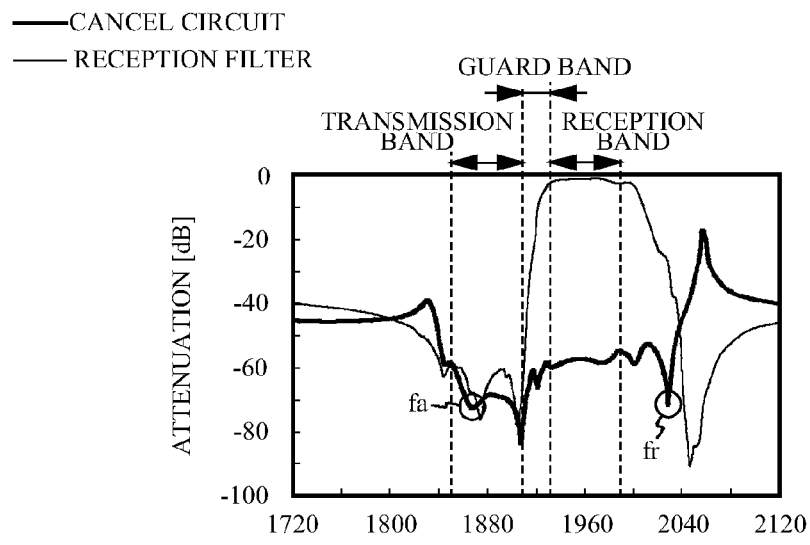
FIG. 20B illustrates simulation results of an amplitude characteristic of a signal transmitted through the cancel circuit.
Figure 20C:
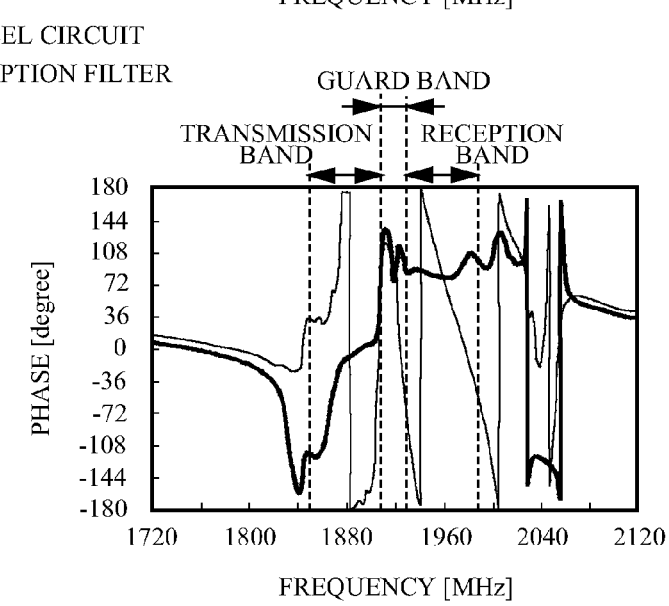
FIG. 20C illustrates simulation results of a phase characteristic.

The inventor's investigation reveals that the above described cancel path can be formed with an acoustic wave resonator. FIG. 20A is a circuit diagram illustrating an exemplary cancel circuit, FIG. 20B illustrates simulation results of amplitude characteristics of a signal transmitted through the cancel circuit, and FIG. 20C illustrates simulation results of a phase characteristic. In FIG. 20B and FIG. 20C, bold lines indicate the amplitude characteristic and the phase characteristic of the signal transmitted through the cancel circuit, and for comparison, thin lines indicate the pass amplitude characteristic and the pass phase characteristic of the reception filter 121 included in the duplexer of the first comparative example. As illustrated in FIG. 20A, a cancel circuit 60 includes capacitors 63 and 64 connected in series between an input connection portion 61 and an output connection portion 62, a first acoustic wave resonator 66 connected between a node 65, which is between the capacitors 63 and 64, and a ground, and a second acoustic wave resonator 67 connected in series between the node 65 and the capacitor 64.

The first acoustic wave resonator 66 and the second acoustic wave resonator 67 make the signal transmitted through the cancel circuit 60 have an amplitude approximately equal to a pass amplitude of a reception filter and a phase almost opposite to a pass phase of the reception filter in the transmission band. The capacitors 63 and 64 make input/output impedance of the cancel circuit 60 high, and thereby reduce the amount of the signal flowing into the cancel circuit 60.

As illustrated in FIG. 20B, a resonance frequency fr of the first acoustic wave resonator 66 is set to a frequency higher than the reception band. An anti-resonance frequency fa of the second acoustic wave resonator 67 is set to a frequency within the transmission band. This setting allows the signal transmitted through the cancel circuit 60 to have an amplitude approximately equal to the pass amplitude of the reception filter 121 in the transmission band. In addition, as illustrated in FIG. 20C, the phase of the signal transmitted through the cancel circuit 60 can be made to be almost opposite to the pass phase of the reception filter 121 in the transmission band by setting the anti-resonance frequency fa of the second acoustic wave resonator 67 to a frequency within the transmission band using phase characteristics of frequencies lower than the resonance frequency fr of the first acoustic wave resonator 66. A description will now be given of a duplexer in accordance with the third embodiment that connects the above described cancel circuit 60 between an antenna terminal and a reception terminal of the duplexer.

Figure 21A:
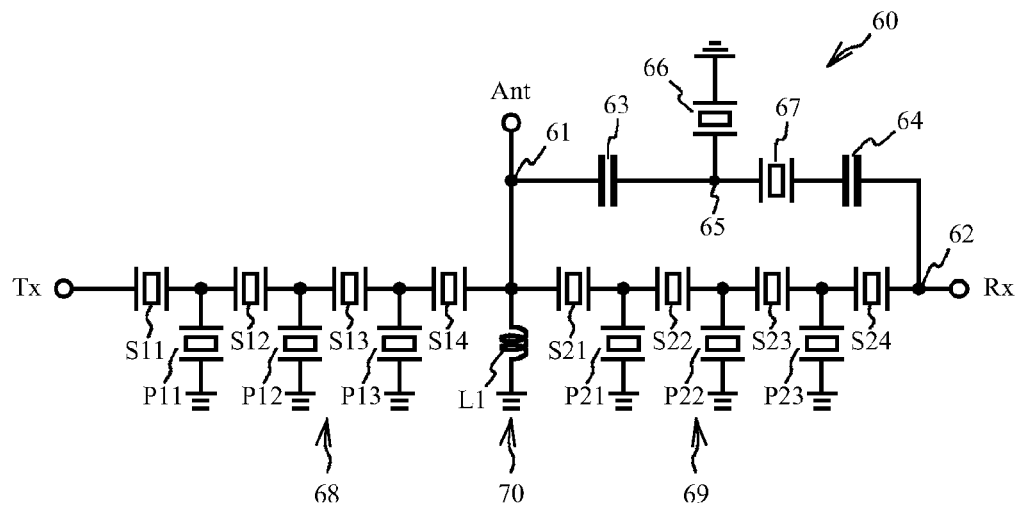
FIG. 21A is a circuit diagram of a duplexer in accordance with a third embodiment.
Figure 21B:
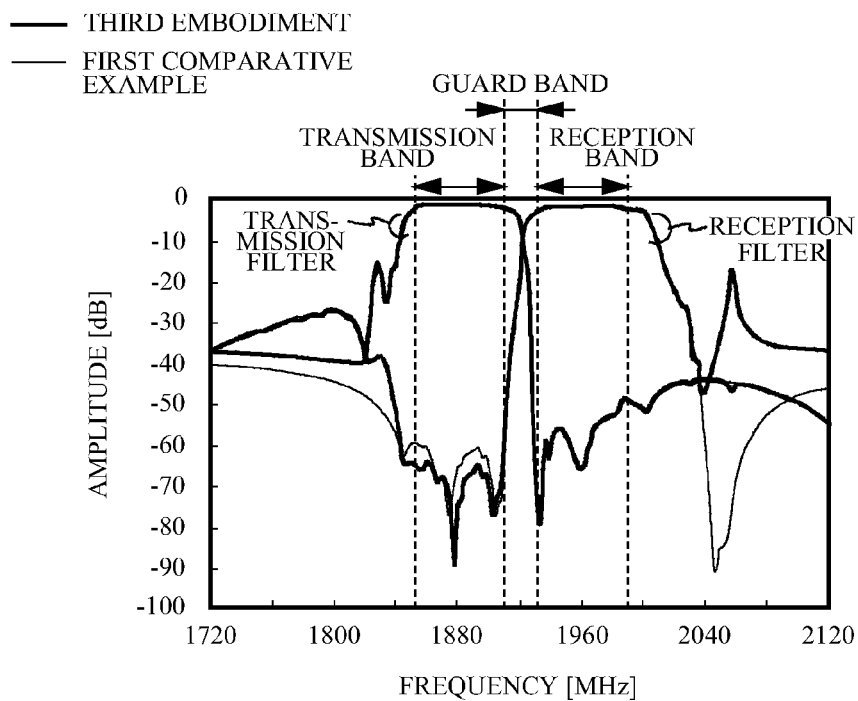
FIG. 21B illustrates simulation results of pass amplitude characteristics of a transmission filter and a reception filter.

FIG. 21A is a circuit diagram of the duplexer in accordance with the third embodiment, and FIG. 21B illustrates simulation results of pass amplitude characteristics of a transmission filter and a reception filter. In FIG. 21B, bold lines indicate pass amplitude characteristics of the transmission filter and the reception filter in the duplexer of the third embodiment, and for comparison, thin lines indicate the pass amplitude characteristics of the transmission filter and the reception filter in the duplexer of the first comparative example. As illustrated in FIG. 21A, the duplexer of the third embodiment includes a transmission filter 68 connected between the antenna terminal Ant and the transmission terminal Tx, a reception filter 69 connected between the antenna terminal Ant and the reception terminal Rx, and a matching circuit 70. The transmission filter 68, the reception filter 69, and the matching circuit 70 have the same configurations as those of the transmission filter 120, the reception filter 121, and the matching circuit 122 of the first comparative example illustrated in FIG. 8A, and thus a description thereof is omitted.

The input connection portion 61 of the cancel circuit 60 is connected to a node between the series resonator S21, which is located closest to the antenna terminal Ant among the resonators of the reception filter 69, and the antenna terminal Ant. The output connection portion 62 of the cancel circuit 60 is connected to a node between the series resonator S24, which is located closest to the reception terminal Rx among the resonators of the reception filter 69, and the reception terminal Rx. The above configuration allows the cancel circuit 60 to be connected in parallel to the reception filter 69 between the antenna terminal Ant and the reception terminal Rx. The cancel circuit 60 has the same configuration as the one illustrated in FIG. 20A, and thus a description thereof is omitted.

As described for FIG. 20B and FIG. 20C, the resonance frequency fr of the first acoustic wave resonator 66 is set to a frequency higher than the reception band. The anti-resonance frequency fa of the second acoustic wave resonator 67 is set to a frequency within the transmission band. The above setting enables the signal transmitted through the cancel circuit 60 to have an amplitude approximately equal to the pass amplitude of the reception filter 69 and a phase almost opposite to the pass phase of the reception filter 69 in the transmission band. Therefore, as illustrated in FIG. 21B, the reception signal in the transmission band can be canceled out by the signal transmitted through the cancel circuit 60, and the degree of suppression of the reception filter 69 in the transmission band can be improved.

In addition, an increase in insertion loss of the reception filter 69 is suppressed because the capacitors 63 and 64 are connected in series between the input connection portion 61 and output connection portion 62 of the cancel circuit 60. Furthermore, only the frequencies near the transmission band satisfy a cancel condition under which the signals transmitted through the reception filter 69 and the cancel circuit 60 cancel out each other, and other frequencies fail to satisfy the cancel condition. Thus, the change of the filter characteristic that changes the passband width is not caused. Therefore, a reduction in the passband width of the reception filter 69 is suppressed.

The third embodiment configures the connection of the input connection portion 61 and output connection portion 62 of the cancel circuit 60 so that the cancel circuit 60 is connected in parallel to a part of the resonators constituting the reception filter 69 as illustrated in FIG. 21A. The cancel circuit 60 includes the first acoustic wave resonator 66 connected between the node 65, which is between the input connection portion 61 and the output connection portion 62, and a ground, and the second acoustic wave resonator 67 connected in series between the input connection portion 61 and the output connection portion 62. The above configuration can suppress an increase in loss in the passband and a reduction in the passband width, and improve the degree of suppression in the blocking band on the low frequency side of the passband of the reception filter 69 (i.e. transmission band) by properly setting the resonance frequency of the first acoustic wave resonator 66 and the anti-resonance frequency of the second acoustic wave resonator 67.

To improve the degree of suppression in the blocking band on the low frequency side of the passband of the reception filter 69 (i.e. transmission band), the resonance frequency of the first acoustic wave resonator 66 and the anti-resonance frequency of the second acoustic wave resonator 67 are preferably set so that the signal transmitted through the cancel circuit 60 has an amplitude approximately equal to the pass amplitude of the reception filter 69 and a phase almost opposite to the pass phase of the reception filter 69 in the blocking band on the low frequency side of the passband of the reception filter 69 (i.e. transmission band). For example, as described for FIG. 20B, the anti-resonance frequency of the second acoustic wave resonator 67 is preferably set to a frequency within the blocking band on the low frequency side of the passband of the reception filter 69 (i.e. transmission band), or a frequency lower than the blocking band (transmission band). Especially, the anti-resonance frequency of the second acoustic wave resonator 67 is more preferably set to a frequency within the blocking band on the low frequency side (transmission band). The resonance frequency of the first acoustic wave resonator 66 is preferably set to a frequency higher than the anti-resonance frequency of the second acoustic wave resonator 67, more preferably to a frequency higher than the blocking band on the low frequency side of the passband of the reception filter 69 (transmission band), and further preferably to a frequency higher than the passband (reception band) of the reception filter 69.

The third embodiment connects the cancel circuit 60 between the antenna terminal Ant (input terminal) and the reception terminal Rx (output terminal) as illustrated in FIG. 21A, but does not intend to suggest any limitation. The third embodiment may connect the cancel circuit 60 between an arbitrary node and another arbitrary node in the reception filter 69 as described for FIG. 13A and FIG. 13B of the first embodiment. Two or more cancel circuits 60 may be connected in parallel between the antenna terminal Ant and the reception terminal Rx.

Figure 22A:
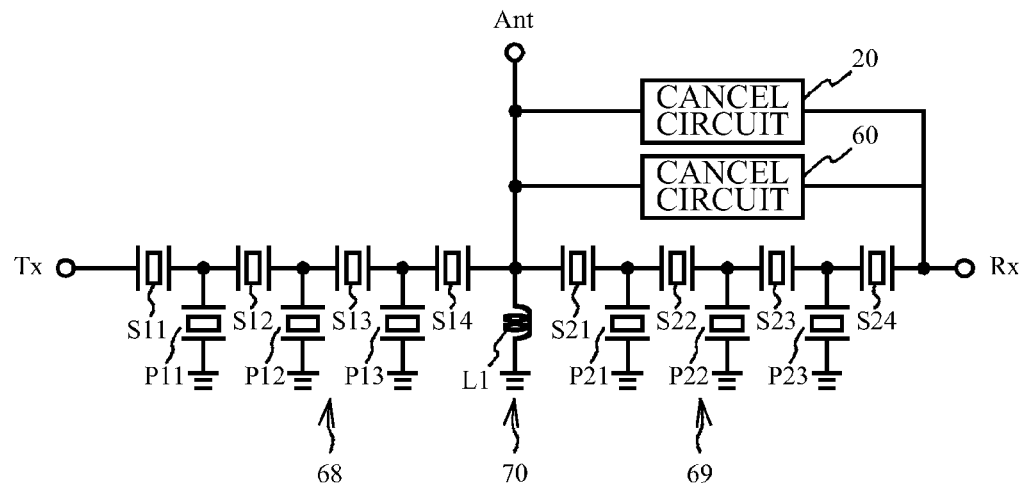
FIG. 22A is a diagram illustrating the duplexer of the third embodiment to which the cancel circuit of the first embodiment is connected.
Figure 22B:
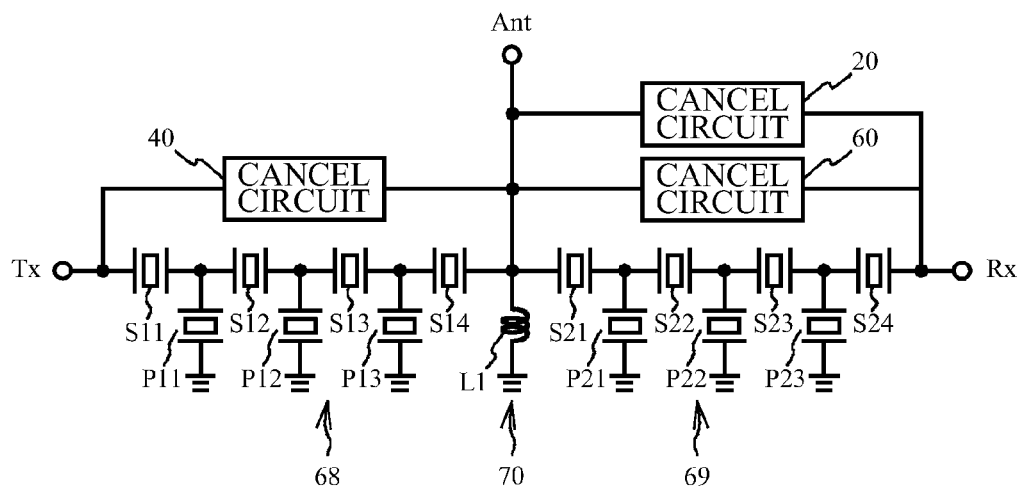
FIG. 22B is a diagram in which the cancel circuit of the second embodiment is additionally connected.

The cancel circuit 20 described in the first embodiment and/or the cancel circuit 40 described in the second embodiment may be additionally connected to a duplexer to which the cancel circuit 60 is already connected. FIG. 22A is a diagram illustrating the duplexer of the third embodiment to which the cancel circuit 20 of the first embodiment is connected, and FIG. 22B is a diagram in which the cancel circuit 40 of the second embodiment is additionally connected. As illustrated in FIG. 22A, the cancel circuit 60 is connected between the antenna terminal Ant and the reception terminal Rx, and furthermore the cancel circuit 20 of the first embodiment is connected between the antenna terminal Ant and the reception terminal Rx. The above configuration enables to improve the steepness of the cutoff characteristic on the low frequency side of the passband of the reception filter 69 in addition to the degree of suppression in the blocking band on the low frequency side of the passband of the reception filter 69 (i.e. transmission band). As illustrated in FIG. 22B, the cancel circuit 40 of the second embodiment is additionally connected between the antenna terminal Ant and the transmission terminal Tx in the duplexer configured as FIG. 22A. The above configuration enables to also improve the degree of suppression in the blocking band on the high frequency side of the passband of the transmission filter 68 (reception band).

Fourth Embodiment

Figure 23A:
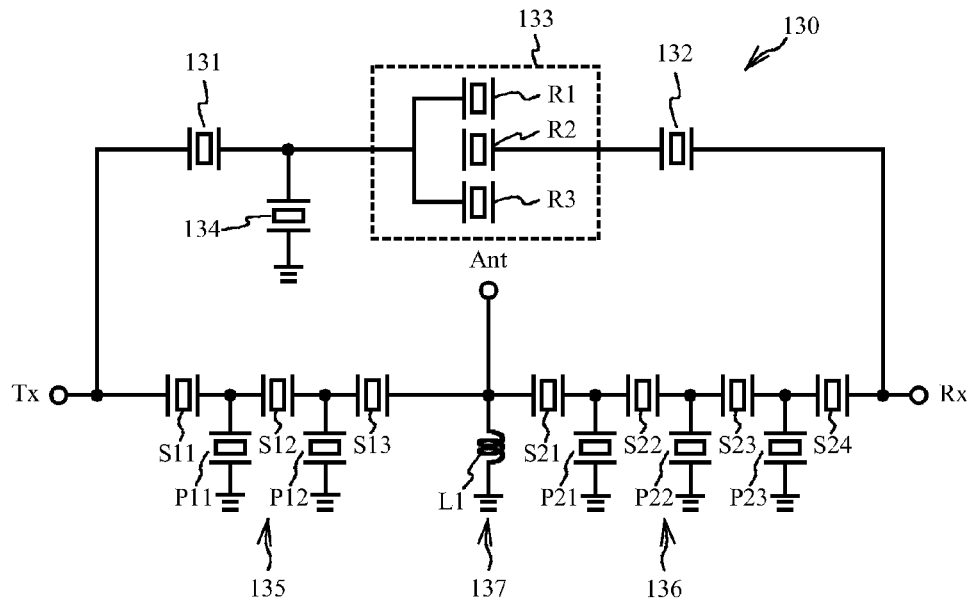
FIG. 23A is a circuit diagram of a duplexer in accordance with a second comparative example.
Figure 23B:
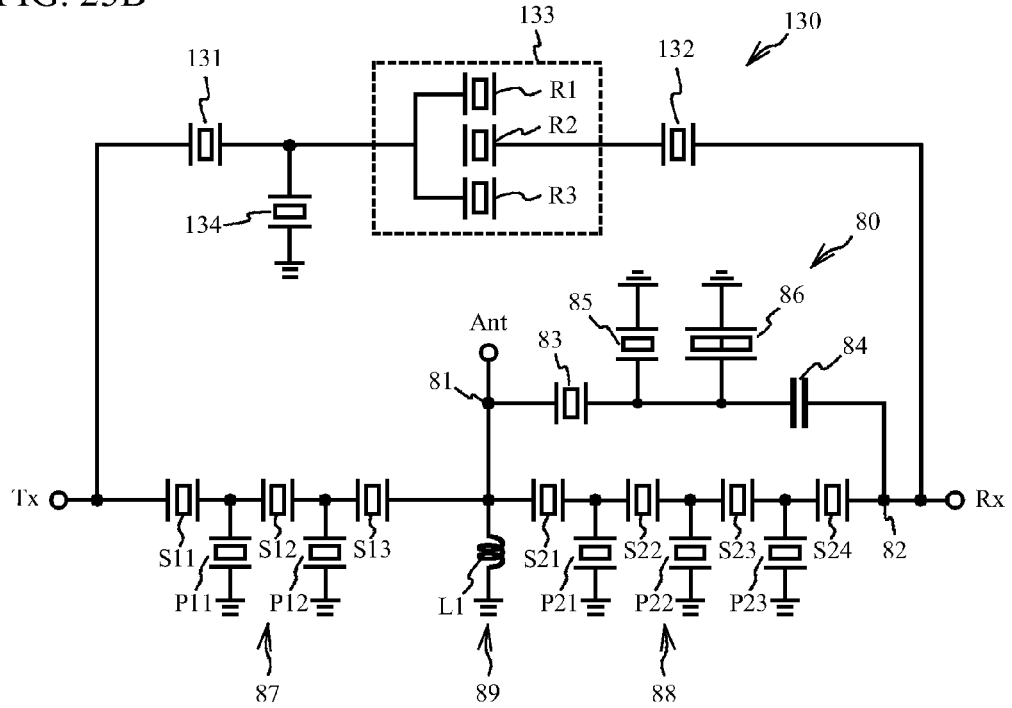
FIG. 23B is a circuit diagram of a duplexer in accordance with a fourth embodiment.

FIG. 23A is a circuit diagram of a duplexer in accordance with a second comparative example, and FIG. 23B is a circuit diagram of a duplexer in accordance with a fourth embodiment. As illustrated in FIG. 23A, the duplexer of the second comparative example uses a four-stage ladder-type filter for a transmission filter 135, and a six-stage ladder-type filter for a reception filter 136. The transmission filter 135 includes series resonators S11 through S13, and parallel resonators P11 and P12. The reception filter 136 includes series resonators S21 through S24, and parallel resonators P21 through P23. The series resonators and the parallel resonators are surface acoustic wave resonators. A matching circuit 137 includes the inductor L1 connected between the antenna terminal Ant and a ground.

A cancel circuit 130 for isolation is connected between a node between the series resonator S11, which is located closest to the transmission terminal Tx among the resonators of the transmission filter 135, and the transmission terminal Tx and a node between the series resonator S24, which is located closest to the reception terminal Rx among the resonators of the reception filter 136, and the reception terminal Rx. The cancel circuit 130 includes acoustic wave resonators 131 and 132, and a multimode type filter 133 that are connected in series. An acoustic wave resonator 134 is connected between a node between the acoustic wave resonator 131 and the multimode type filter 133 and a ground. Three acoustic wave resonators R1 through R3 form the multimode type filter 133. The acoustic wave resonators 131, 132, 134, and R1 through R3 are surface acoustic wave resonators. The cancel circuit 130 for isolation is designed to allow a signal transmitted through the cancel circuit 130 to have an amplitude approximately equal to and a phase almost opposite to an amplitude and a phase of an isolation signal of the duplexer respectively. The connection of the cancel circuit 130 for isolation improves an isolation characteristic.

As illustrated in FIG. 23B, the duplexer of the fourth embodiment includes a transmission filter 87, a reception filter 88, and a matching circuit 89 that have the same configurations as those of the transmission filter 135, the reception filter 136, and the matching circuit 137 of the second comparative example respectively. A cancel circuit 80 is connected between a node between the series resonator S21, which is located closest to the antenna terminal among the resonators of the reception filter 88, and the antenna terminal Ant and a node between the series resonator S24, which is located closest to the reception terminal Rx, and the reception terminal Rx. The cancel circuit 80 includes an acoustic wave resonator 83 and a capacitor 84 connected in series between an input connection portion 81 and an output connection portion 82. An acoustic wave resonator 85 and a first acoustic wave resonator 86 are connected between a node between the acoustic wave resonator 83 and the capacitor 84 and a ground. Other configurations are the same as those of the second comparative example illustrated in FIG. 23A, and thus a description thereof is omitted.

Resonance frequencies of the acoustic wave resonators 83 and 85 are set sufficiently high so that they function as a capacitor near the reception band of the reception filter 88. The first acoustic wave resonator 86 is designed to include two regions having different widths and periods of electrode fingers of comb-shaped electrodes, and thus has two different resonance frequencies. The two resonance frequencies are set to frequencies lower than the guard band between the reception band and the transmission band as described for FIG. 12 to improve a cutoff characteristic on a low frequency side of a passband of the reception filter 88. Moreover, an anti-resonance frequency of the first acoustic wave resonator 86 is set to a frequency within the guard band in the same manner described in FIG. 9B.

Figure 24:
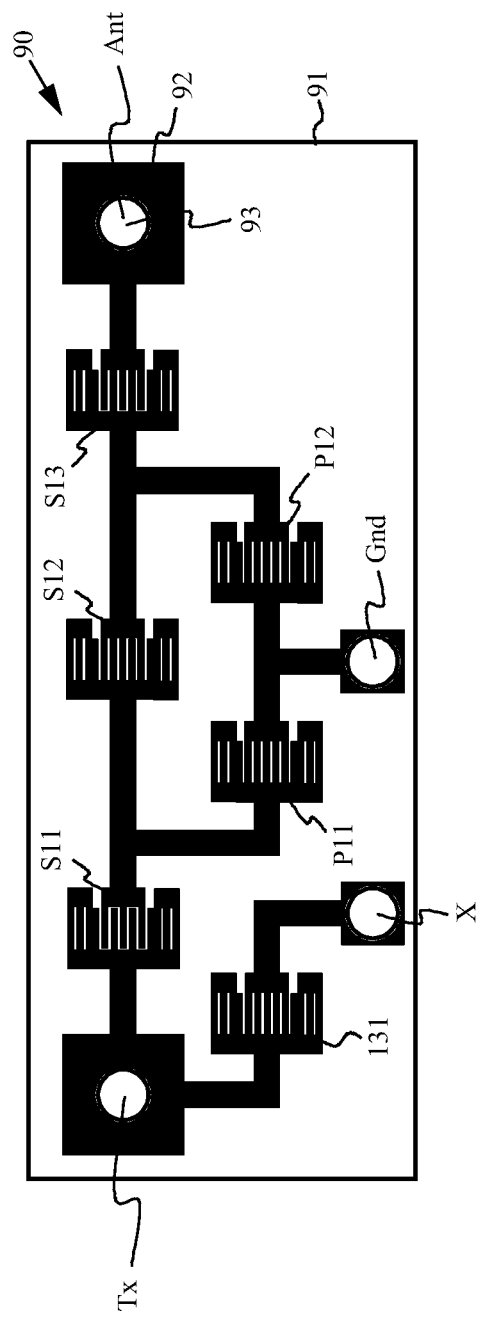
FIG. 24 is a plan view of a transmission filter chip of the second comparative example or the fourth embodiment.

FIG. 24 is a plan view of a transmission filter chip in accordance with the second comparative example or the fourth embodiment. As illustrated in FIG. 24, the transmission filter chip of the second comparative example has the same structure as that of the transmission filter chip of the fourth embodiment. In a transmission filter chip 90, a metal film made of Al is formed on a piezoelectric substrate 91 made of a lithium tantalate substrate. The metal film forms resonators, a pad 92, and wirings. A bump 93 is formed on the pad 92. The pad 92 includes a pad Ant connected to an antenna terminal, a pad Tx connected to a transmission terminal, a pad Gnd connected to a ground, and a pad X connected to the multimode type filter 133 of the cancel circuit 130 for isolation. The resonators correspond to the resonators illustrated in FIG. 23A and FIG. 23B.

Figure 25A:
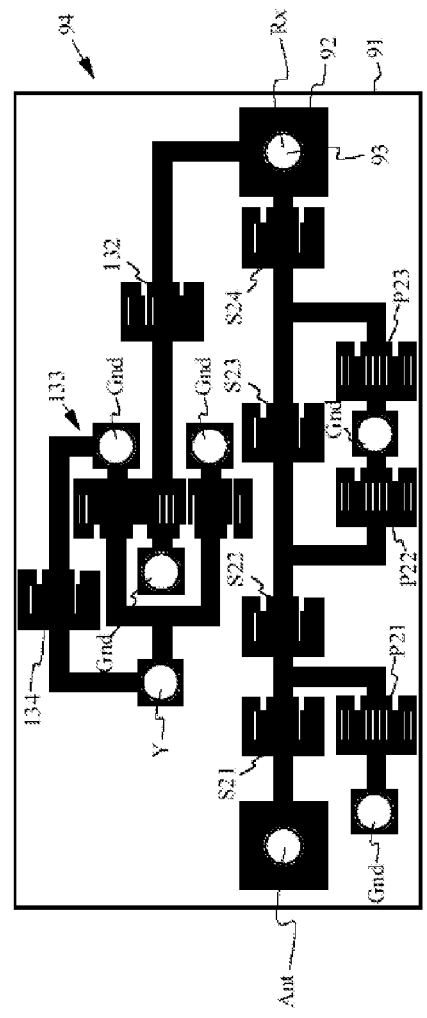
FIG. 25A is a plan view of a reception filter chip of the second comparative example.
Figure 25B:
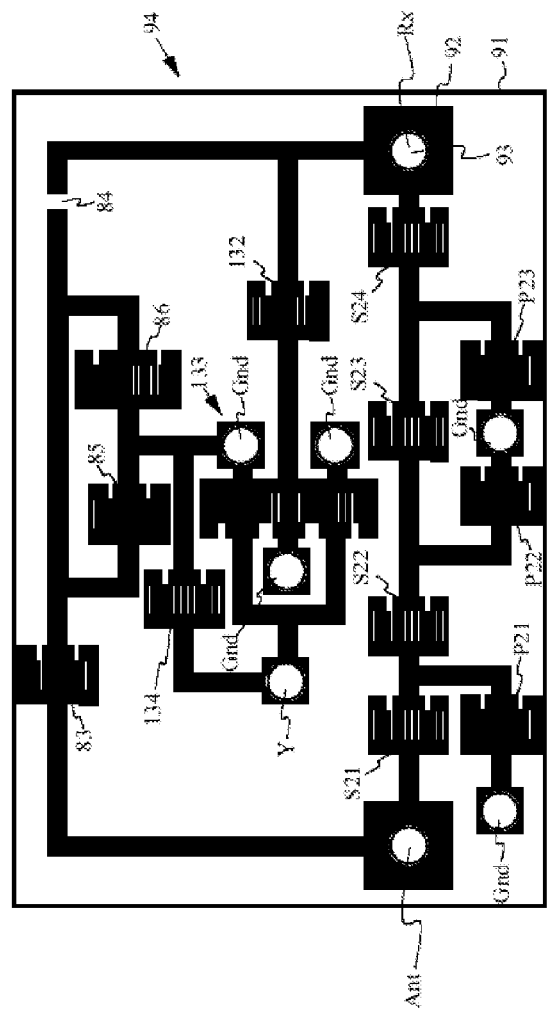
FIG. 25B is a plan view of a reception filter chip of the fourth embodiment.

FIG. 25A is a plan view of a reception filter chip of the second comparative example, and FIG. 25B is a plan view of a reception filter of the fourth embodiment. As illustrated in FIG. 25A, in a reception filter chip 94 of the second comparative example, a metal film made of Al is formed on the piezoelectric substrate 91 made of a lithium tantalate substrate. The metal film forms resonators, the pad 92, and wirings. The bump 93 is formed on the pad 92. The pad 92 includes the pad Ant connected to the antenna terminal, a pad Rx connected to a reception terminal, the pads Gnd connected to a ground, and a pad Y connected to the acoustic wave resonator 131 of the cancel circuit 130 for isolation. As illustrated in FIG. 24B, in the reception filter chip 94 of the fourth embodiment, all resonators and components that form the cancel circuit 80 are further formed on the piezoelectric substrate 91. The capacitor 84 is a parasitic capacitor formed between the wirings. The resonators correspond to the resonators illustrated in FIG. 23A and FIG. 23B.

As described above, the resonator and the capacitor that forms the cancel circuit 80 are formed on the piezoelectric substrate 91 with the series resonators S21 through S24 and the parallel resonators P21 through P23 formed thereon. The above configuration enables to downsize the duplexer.

Figure 26A:
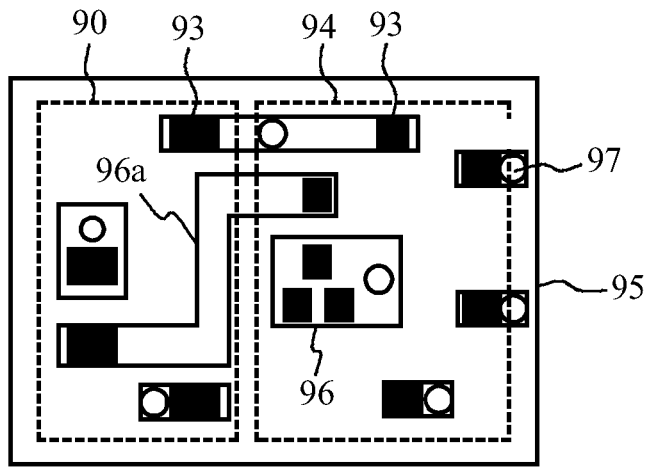
FIG. 26A through FIG. 26C are plan views of a multilayered substrate on which the transmission filter chip and the reception filter chip of the duplexer of the second comparative example or the fourth embodiment are mounted.
Figure 26B:
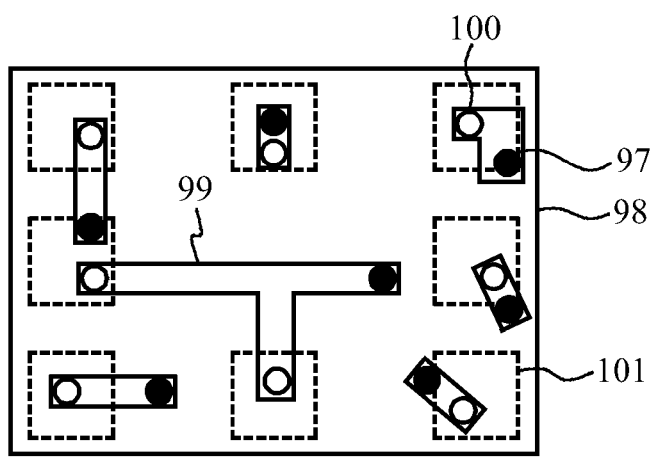
Figure 26C:
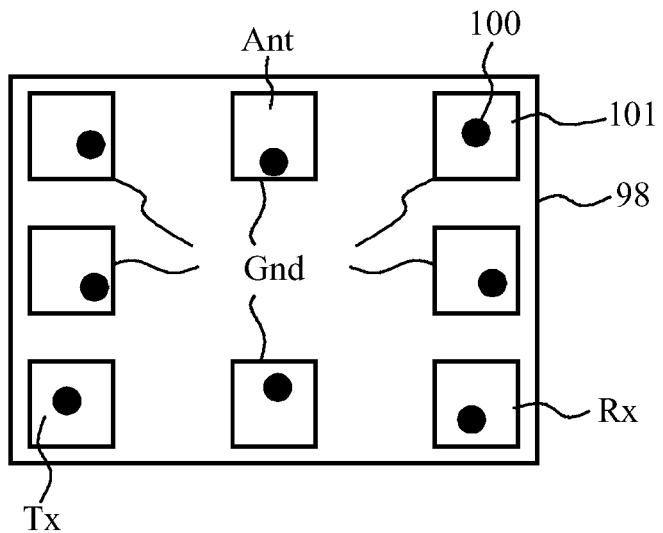

FIG. 26A through FIG. 26C are plan views of a multilayered substrate on which the transmission filter chip and the reception filter chip of the second comparative example or the fourth embodiment are mounted. FIG. 26A is a top view of a die attach layer on which the transmission filter chip and the reception filter chip are flip-chip mounted, and illustrates the transmission filter chip and the reception filter chip transparently. FIG. 26B is a top view of a foot pad layer. FIG. 26C is a bottom view illustrating the foot pad layer transparently. As illustrated in FIG. 26A, a wiring 96 made of a metal such as copper is formed on a top surface of a die attach layer 95 made of an insulating material such as ceramic. The transmission filter chip 90 and the reception filter chip 94 are face-down mounted on the wiring 96 with the bumps 93. A wiring 96a for a cancel circuit electrically connects the acoustic wave resonator 131 located on the transmission filter chip 90 to the multimode type filter 133 located on the reception filter chip 94. A via 97 is a via in which a metal piercing through the die attach layer 95 is embedded.

As illustrated in FIG. 26B, a wiring 99 made of a metal such as copper is formed on a top surface of a foot pad layer 98 made of an insulating material such as ceramic. The via 97 piercing through the die attach layer 95 is electrically connected to the wiring 99. A via 100 is a via in which a metal piercing through the foot pad layer 98 is embedded.

As illustrated in FIG. 26C, the via 100 piercing through the foot pad layer 98 is electrically connected to a foot pad 101 formed on a bottom surface of the foot pad layer 98. The foot pad 101 includes a foot pad Ant connected to the antenna terminal, a foot pad Tx connected to the transmission terminal, a foot pad Rx connected to the reception terminal, and foot pads Gnd connected to a ground.

Figure 27:
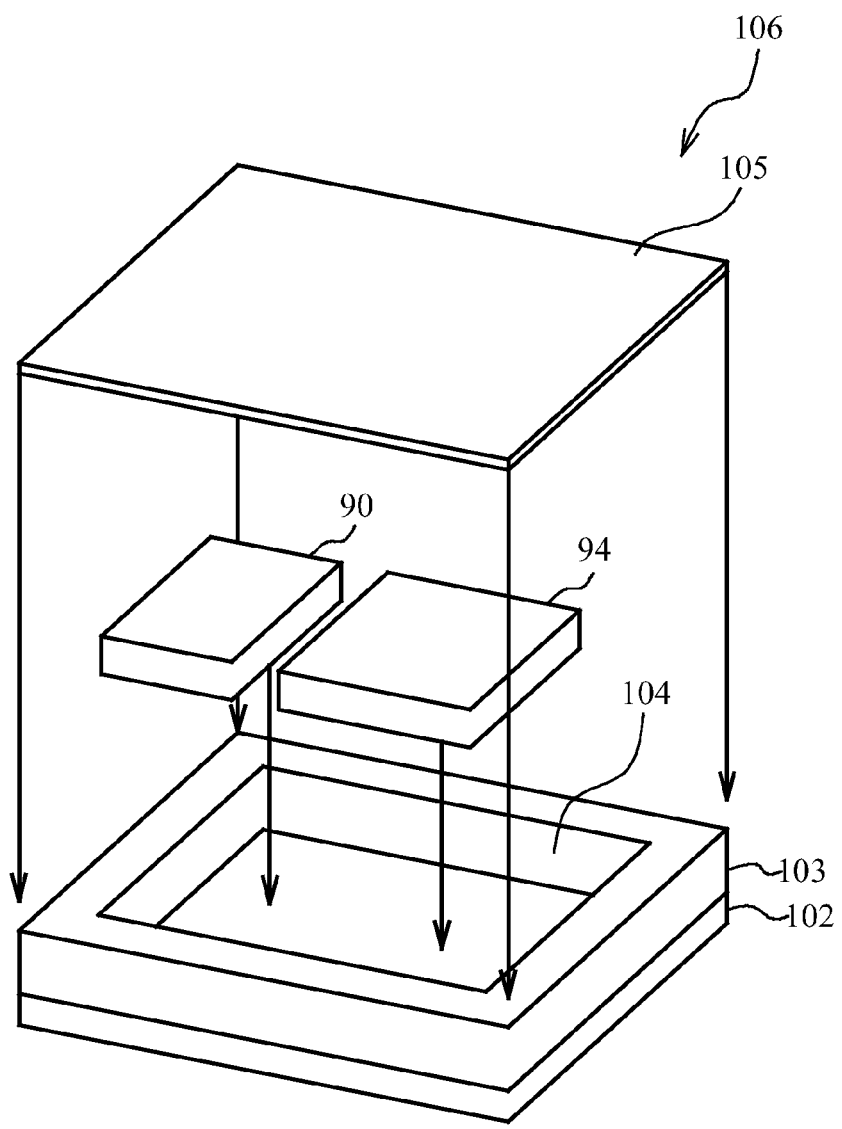
FIG. 27 is an exploded perspective view illustrating a package.

FIG. 27 is an exploded perspective view illustrating a package. As illustrated in FIG. 27, a cavity layer 103 made of an insulating material such as ceramic is formed on a multilayered substrate 102 including a die attach layer and a foot pad layer. A cavity 104 is formed at a center part of the cavity layer 103. The transmission filter chip 90 and the reception filter chip 94 are flip-chip mounted on the multilayered substrate 102. A lid 105 made of a metal is bonded on the cavity layer 103. This allows the transmission filter chip 90 and the reception filter chip 94 to be sealed in the cavity 104 hermetically. The above configuration enables to obtain a package 106 in which the transmission filter chip 90 and the reception filter chip 94 are mounted.

Figure 28A:
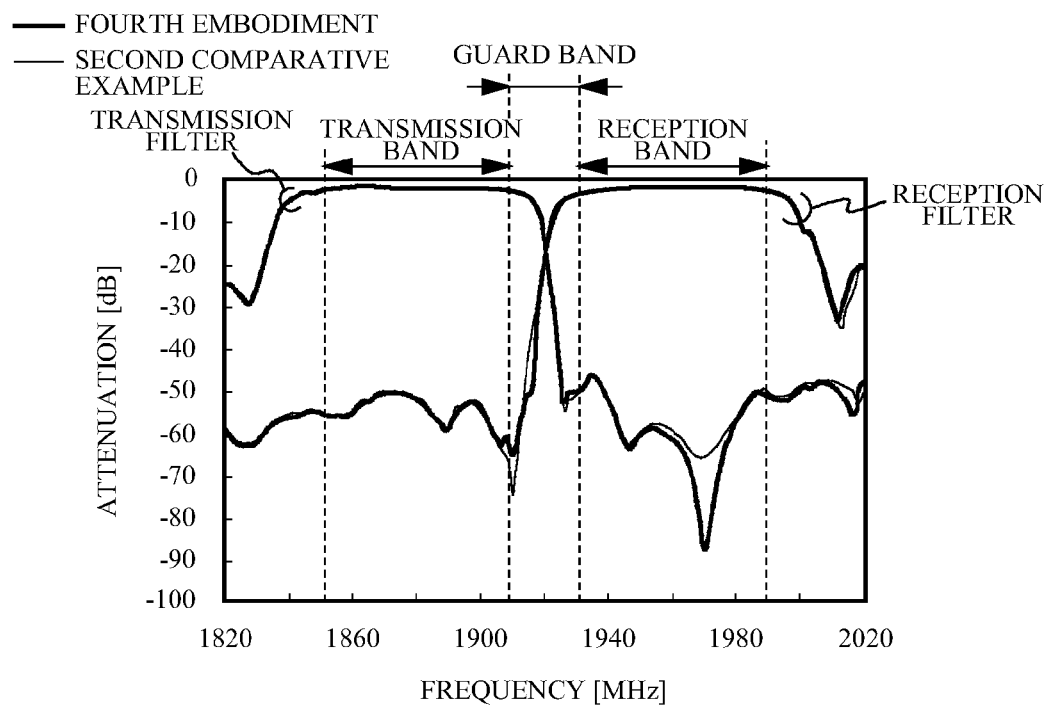
FIG. 28A illustrates measurement results of filter characteristics of the duplexer s of the second comparative example and the fourth embodiment.
Figure 28B:
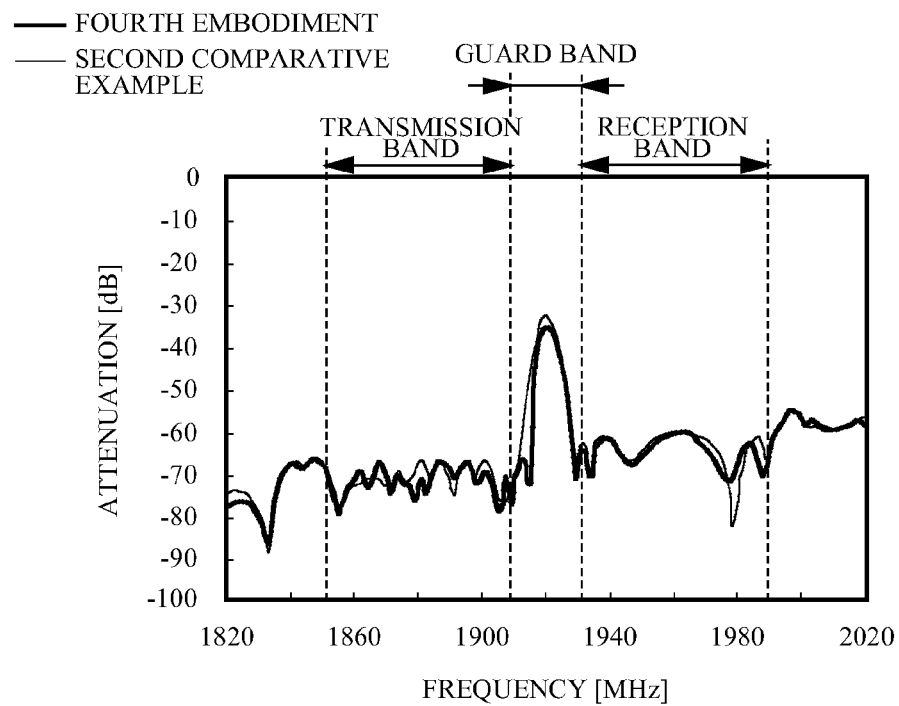
FIG. 28B illustrates measurement results of isolation characteristics.

FIG. 28A illustrates measurement results of filter characteristics of the duplexers of the second comparative example and the fourth embodiment, and FIG. 28B illustrates measurement results of isolation characteristics. In FIG. 28A and FIG. 28B, thin lines indicate measurement results of the second comparative example, and bold lines indicate measurement results of the fourth embodiment. FIG. 28A and FIG. 28B reveal that the fourth embodiment improves the steepness of the cutoff characteristic on the low frequency side of the passband of the reception filter 88 and the steepness of the isolation characteristic in low frequencies within the guard band compared to the second comparative example because of the cancel circuit 80 connected between the antenna terminal Ant and the reception terminal Rx.

The first through fourth embodiments describe exemplary duplexers for North American PCS with a transmission band of 1850 to 1910 MHz and a reception band of 1930 to 1990 MHz. However, these embodiments are applicable to duplexers using other transmission bands and reception bands. For example, these embodiments are applicable to duplexers for Cellular system with a transmission band of 824 to 849 MHz and a reception band of 869 to 894 MHz.

In addition, the first through fourth embodiments describe the reception band higher than the transmission band. That is to say, when a first filter is the transmission filter or the reception filter, whichever has a lower passband, and a second filter is the other one that has a higher passband, the first through fourth embodiments describe the first filter as the transmission filter, and the second filter as the reception filter. However, the transmission band may be higher than the reception band. That is to say, the first filter may be the reception filter, and the second filter may be the transmission filter. Therefore, when the first filter is connected between the antenna terminal and the first terminal and the second filter is connected between the antenna terminal and the second terminal, the first and third embodiments connect the cancel circuits 20 and 60 between the antenna terminal and the second terminal, and the second embodiment connects the cancel circuit 40 between the antenna terminal and the first terminal.

In addition, the first through fourth embodiments improve the steepness of the cutoff characteristic on the low frequency side of the passband of or the degree of suppression in the blocking band of the transmission filter or reception filter that forms the duplexer. However, those embodiments are applicable to filters other than the reception filter and the transmission filter.

Fifth Embodiment

Figure 29:
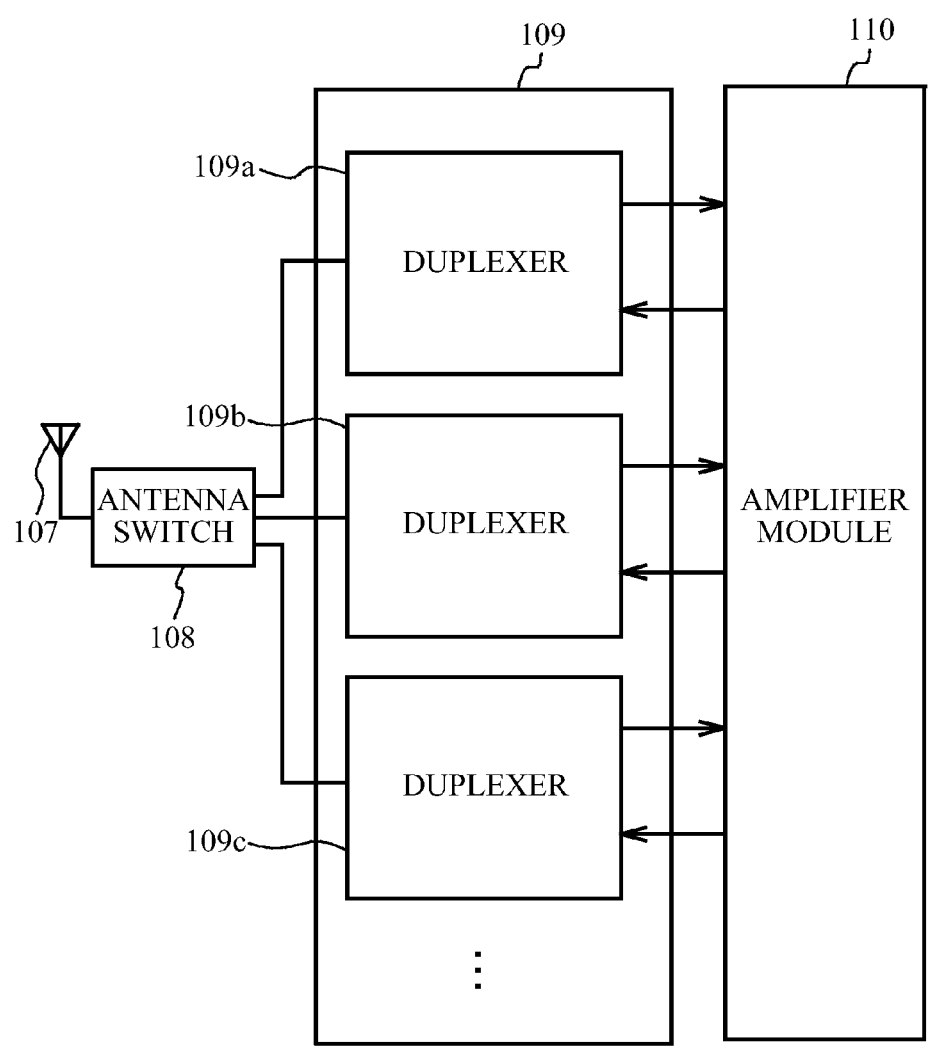
FIG. 29 is a block diagram illustrating a communication module in accordance with a fifth embodiment.

A fifth embodiment is an exemplary communication module that includes any one of the duplexers of the first through fourth embodiments. FIG. 29 is a block diagram illustrating a communication module of the fifth embodiment. As illustrated in FIG. 29, the communication module includes an antenna 107, an antenna switch 108, a duplexer bank 109, and an amplifier module 110. The communication module is an RF (Radio Frequency) module for mobile phones, for example, and supports two or more communication methods such as GSM (Global System for Mobile Communication) (registered trademark) and W-CDMA (Wideband Code Division Multiple Access). The antenna 107 can transmit and receive both signals of GSM and W-CDMA.

The duplexer bank 109 includes duplexers 109a through 109c. The duplexers 109a through 109c are duplexers that support respective communication methods. The antenna switch 108 selects the duplexer that supports the communication method of a signal to be transmitted or received among the duplexers included in the duplexer bank 109, and connects it to the antenna 107. The duplexers are connected to the amplifier module 110. The amplifier module 110 amplifies the signals received by the reception filters of the duplexers 109a through 109c, and outputs them to the processing unit. In addition, the amplifier module 110 amplifies the signal generated by the processing unit, and output it to the transmission filters of the duplexers 109a through 109c.

At least one of the duplexers 109a through 109c is any one of the duplexers of the first through fourth embodiments. This allows an increase in loss in the passband and a reduction in the passband width to be suppressed, and the cutoff characteristic on the low frequency side of the passband of the filter to be steep. Or, this allows an increase in loss in the passband and a reduction in the passband width to be suppressed, and the degree of suppression in the blocking band on the low frequency side or the high frequency side of the passband of the filter to be improved. The communication module may be mounted in an electronic device such as a wireless LAN (Local Area Network), a personal computer, and a PDA (Personal Digital Assistant).

Although the embodiments of the present invention have been described in detail, it is to be understood that the various change, substitutions, and alterations could be made hereto without departing from the spirit and scope of the invention.

What is claimed is:

1. A filter comprising:
acoustic wave resonators located in a first path connected between an input terminal and an output terminal; and
a cancel circuit including a second path and a first acoustic wave resonator, the second path having a first and a second nodes, each of which is located in the first path so that the second path is parallelly connected to at least a part of the acoustic wave resonators, and one end of the first acoustic wave resonator being connected to a third node that is located between the first and the second nodes in the second path and another end of the first acoustic wave resonator being connected to ground.

2. The filter according to claim 1, wherein
the first acoustic wave resonator has an anti-resonance frequency that is set to a frequency within a transition band between a passband of the filter and a blocking band on a low frequency side of the passband, and a resonance frequency that is set to a frequency within the transition band or a frequency lower than the transition band.

3. The filter according to claim 1, wherein
the cancel circuit includes a capacitor or an acoustic wave resonator that is connected in parallel to the first acoustic wave resonator.

4. The filter according to claim 1, wherein
the first acoustic wave resonator has a resonance frequency that is set to a frequency within a blocking band on a high frequency side of a passband of the filter.

5. The filter according to claim 4, wherein
the first acoustic wave resonator has a resonance frequency that is set to around a frequency that is within the blocking band on the high frequency side of the passband and at which a pass phase of the filter reverses.

6. The filter according to claim 1, wherein
the cancel circuit includes a second acoustic wave resonator that is located in the second path and is connected in series between the first and the second nodes,
the second acoustic wave resonator has an anti-resonance frequency that is set to a frequency within a blocking band on a low frequency side of a passband of the filter or a frequency lower than the blocking band, and
the first acoustic wave resonator has a resonance frequency that is set to a frequency higher than the anti-resonance frequency of the second acoustic wave resonator.

7. The filter according to claim 1, wherein
the cancel circuit includes a capacitor or a second acoustic wave resonator that is located in the second path and that is connected in series between the first and the second nodes.

8. The filter according to claim 1, wherein
the first acoustic wave resonator has two or more resonance frequencies.

9. The filter according to claim 1, wherein
the cancel circuit includes a plurality of the first acoustic wave resonators that have mutually different resonance frequencies.

10. The filter according to claim 1, wherein
the cancel circuit is connected between the input terminal and the output terminal.

11. The filter according to claim 1, wherein
a plurality of the cancel circuits are connected in parallel to at least a part of the acoustic wave resonators.

12. A communication module comprising:
the filter according to claim 1.

13. A duplexer comprising:
a first filter that is connected between an antenna terminal and a first terminal and that includes a first group of acoustic wave resonators that are located in a first path connected between the antenna terminal and the first terminal;
a second filter that is connected between the antenna terminal and a second terminal and that includes a second group of acoustic wave resonators that are located in a second path connected between the antenna terminal and the second terminal, the second filter having a passband higher than a passband of the first filter; and
a cancel circuit including a third path and a first acoustic wave resonator, the third path having a first and a second nodes, each of which is located in the first path or the second path so that the third path is parallelly connected to at least a part of the first or second group of acoustic wave resonators, and one end of the first acoustic wave resonator being connected to a third node that is located between the first and the second nodes in the third path and another end of the first acoustic wave resonator being connected to ground.

14. The duplexer according to claim 13, wherein
the cancel circuit is connected in parallel to at least a part of the second group of acoustic wave resonators, and
the first acoustic wave resonator has an anti-resonance frequency that is set to a frequency within a guard band between a passband of the first filter and a passband of the second filter, and a resonance frequency that is set to a frequency within the guard band or a frequency lower than the guard band.

15. The duplexer according to claim 13, wherein the cancel circuit is connected in parallel to at least a part of the first group of acoustic wave resonators, and the first acoustic wave resonator has a resonance frequency that is set to a frequency within a passband of the second filter.

16. The duplexer according to claim 13, wherein the cancel circuit is connected in parallel to at least a part of the second group of acoustic wave resonators and includes a second acoustic wave resonator that is located in the third path and is connected in series between the first and the second nodes, and the second acoustic wave resonator has an anti-resonance frequency that is set to a frequency within a passband of the first filter or a frequency lower than a passband of the first filter; and the first acoustic wave resonator has a resonance frequency that is set to a frequency higher than the anti-resonance frequency of the second acoustic wave resonator.

17. A communication module comprising:

the duplexer according to claim 13.

18. The duplexer according to claim 13, wherein one of the first and the second nodes is directly connected to the antenna terminal and another of the first and the second nodes is directly connected to the first terminal or the second terminal.

19. The duplexer according to claim 13, wherein the cancel circuit includes at least one of a capacitor and a second acoustic wave resonator that is located in the third path and that is connected in series between the first and the second nodes.

* * * * *